(12) United States Patent
Yun et al.

(10) Patent No.: US 11,670,963 B2
(45) Date of Patent: Jun. 6, 2023

(54) ELECTRONIC DEVICE INCLUDING WIRELESS CHARGING STRUCTURE

(71) Applicant: Samsung Electronics Co., Ltd., Suwon-si (KR)

(72) Inventors: Chanhun Yun, Suwon-si (KR); Minsoo Kim, Suwon-si (KR); Donghyeon Yeo, Suwon-si (KR); Junghui Park, Suwon-si (KR); Jiwoo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 384 days.

(21) Appl. No.: 16/852,884

(22) Filed: Apr. 20, 2020

(65) Prior Publication Data

US 2020/0373784 A1 Nov. 26, 2020

(30) Foreign Application Priority Data

May 20, 2019 (KR) .......................... 10-2019-0058857

(51) Int. Cl.
*H02J 50/10* (2016.01)
*H02J 50/00* (2016.01)
(Continued)

(52) U.S. Cl.
CPC ............ *H02J 50/10* (2016.02); *H02J 7/0044* (2013.01); *H02J 50/005* (2020.01); *H05K 1/0281* (2013.01); *H05K 2201/10128* (2013.01)

(58) Field of Classification Search
CPC ........ H02J 50/10; H02J 7/0044; H02J 50/005; H02J 7/0047; H02J 50/90; H02J 50/80;
(Continued)

(56) References Cited

U.S. PATENT DOCUMENTS

2015/0326054 A1 11/2015 Park et al.
2017/0004921 A1 1/2017 Kim et al.
(Continued)

FOREIGN PATENT DOCUMENTS

| KR | 10-2012-0136215 A | 12/2012 |
| KR | 10-2014-0086363 A | 7/2014 |
| WO | 2019/054747 A2 | 3/2019 |

OTHER PUBLICATIONS

International Search Report dated Jul. 24, 2020, International Application No. PCT/KR2020/005197.
(Continued)

*Primary Examiner* — Stacy Whitmore
(74) *Attorney, Agent, or Firm* — Jefferson IP Law, LLP

(57) ABSTRACT

An electronic device is provided. The electronic device includes a housing including a front plate that faces a first direction and a rear plate that faces a second direction, which is opposite the first direction, a display panel configured to output a screen through the front plate, a bracket disposed between the display panel and the rear plate, the bracket being configured to support internal components, a flexible printed circuit board including a first area electrically connected to the display panel, and a second area extending from the first area and disposed between the display panel and the bracket, a wireless charging structure disposed on one face of the second area or inside the second area, the wireless charging structure including a coil portion and transmission wires electrically connected to the coil portion, and a magnetic plate disposed between the bracket and the flexible printed circuit board, and at least one area of the magnetic plate being disposed to face the wireless charging structure.

20 Claims, 15 Drawing Sheets

(51) Int. Cl.
*H02J 7/00* (2006.01)
*H05K 1/02* (2006.01)

(58) Field of Classification Search
CPC .............. H02J 7/02; H05K 1/0281; H05K
2201/10128; H05K 1/144; H05K
2201/042; H05K 2201/086; H05K
2201/10037; H05K 2201/10098; H05K
2201/10189; H05K 1/147; H05K 1/165;
G04C 10/00; G04G 19/00; G06F 1/1626;
G06F 1/163; G06F 1/1632; G06F 1/1635;
G06F 1/1698; G06F 1/263; G06F 1/266;
G06F 1/1658; G06F 1/26; H04M 1/026;
H04M 1/0262; H04M 1/0266; H04M
1/0268; H04M 1/0277; H01F 27/085;
H01F 27/36
See application file for complete search history.

(56) References Cited

U.S. PATENT DOCUMENTS

| | | |
|---|---|---|
| 2017/0098951 A1 | 4/2017 | Olgun et al. |
| 2018/0077806 A1 | 3/2018 | Harmon et al. |
| 2018/0301792 A1 | 10/2018 | Park et al. |
| 2020/0212726 A1 | 7/2020 | Hwang |

OTHER PUBLICATIONS

European Search Report dated Feb. 15, 2021, issued in European Application No. 20171776.6.

| Stack Configuration | A-A' SMD/1st Shielding Area | B-B' Coil Area | C-C' 2nd Shielding Area |
|---|---|---|---|
| Graphite Sheet | SMD Component | | |
| Magnetic Plate | | | |
| Copper Foil Circuit Layer | | | |
| Thin Copper Plate | | | |
| Substrate Layer(Base flim) | | | |
| Thin Copper Plate | | | |
| Dielectric Layer(Prepreg) | | | |
| Thin Copper Plate | | | |
| Substrate Layer(Base flim) | | | |
| Thin Copper Plate | | | |
| Dielectric Layer(Prepreg) | | | |
| Thin Copper Plate | | | |
| Substrate Layer(Base flim) | | | |
| Thin Copper Plate | | | |
| Dielectric Layer(Prepreg) | | | |

FIG. 16

ELECTRONIC DEVICE INCLUDING WIRELESS CHARGING STRUCTURE

CROSS-REFERENCE TO RELATED APPLICATION(S)

This application is based on and claims priority under 35 U.S.C. § 119(a) of a Korean patent application number 10-2019-0058857, filed on May 20, 2019, in the Korean Intellectual Property Office, the disclosure of which is incorporated by reference herein in its entirety.

BACKGROUND

1. Field

The disclosure relates to an electronic device including a wireless charging structure.

2. Description of Related Art

Electronic devices may output information stored therein as sound or an image. As the integration degree of electronic devices has increased and super-high speed and large-capacity wireless communication has become popular, various functions have recently been provided in a single electronic device, such as a mobile communication terminal. For example, various functions, such as an entertainment function (e.g., a game function), a multimedia function (e.g., a music/video reproducing function), a communication and security function for mobile banking or the like, a schedule management function, and an e-wallet function, are integrated in a single electronic device, in addition to a communication function.

In addition, in an information-based society, the importance of sensors embedded in electronic devices and power supply problems is increasingly emphasized in order for information communication devices to operate and connect with each other regardless of time or place. Generally, as the types of mobile devices, such as mobile phones have been rapidly diversified, the operation of charging the batteries of mobile devices requires time and labor of users. As a way to address this issue, wireless power transmission technology has recently attracted attention. For example, a wireless power reception device, such as a mobile device that receives energy wirelessly, may be driven by the received wireless power, or may be driven using power charged to a battery thereof using the received wireless power.

Wireless power transmission technology (wireless power transmission or wireless energy transfer) is a technology for transmitting electric energy from a transmitter to a receiver wirelessly using the induction principle of a magnetic field. The wireless energy transmission scheme may be generally classified into a magnetic induction scheme, an electromagnetic resonance scheme, and a power transmission scheme using a short-wavelength radio frequency.

The above information is presented as background information only to assist with an understanding of the disclosure. No determination has been made, and no assertion is made, as to whether any of the above might be applicable as prior art with regard to the disclosure.

SUMMARY

In general, a wireless charging structure for wireless charging may be disposed so as to face the rear side (e.g., the side opposite the side on which a display is disposed) of an electronic device. However, there is a demand for a wireless charging structure in which the wireless charging structure embedded in an electronic device includes receive (RX) and transmit (TX) functions, or a wireless charging structure in which a charging function is provided towards a display direction in an electronic device including a foldable display.

Since the wireless charging structure providing the charging function towards the display direction is provided in a structure in which a display, a wireless charging structure, and a conductive layer are sequentially stacked, it is difficult to pull out a connection structure of flexible printed circuit board (FPCB) of the wireless charging structure, and due to the increase in length, a direct current (DC) resistance component may increase, surface heat generation may be caused, or charging efficiency may decrease.

Additional height compensation structures may be required due to changes in the size and arrangement of the wireless charging structure, resulting in lower workability and increased material costs.

With an electronic device according to this disclosure, it is possible to improve a stack structure, to simplify the structure, and to provide an effect of reducing a material cost by arranging a wireless charging structure for providing RX and TX functions in a display assembly.

However, issues to be addressed in this disclosure are not limited to those described above, and may be variously expanded without departing from the spirit and scope of this disclosure.

Aspects of the disclosure are to address at least the above-mentioned problems and/or disadvantages and to provide at least the advantages described below. Accordingly, an aspect of the disclosure is to provide an electronic device including a wireless charging structure.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a front plate that faces a first direction and a rear plate that faces a second direction, which is opposite the first direction, a display panel configured to output a screen through the front plate, a bracket disposed between the display panel and the rear plate, the bracket being configured to support internal components, a flexible printed circuit board including a first area electrically connected to the display panel, and a second area extending from the first area and disposed between the display panel and the bracket, a wireless charging structure disposed on one face of the second area or inside the second area, the wireless charging structure including a coil portion and transmission wires electrically connected to the coil portion, and a magnetic plate disposed between the bracket and the flexible printed circuit board, and at least one area of the magnetic plate being disposed to face the wireless charging structure.

In accordance with another aspect of the disclosure, an electronic device is provided. The electronic device includes a housing including a front plate that faces a first direction and a rear plate that faces a second direction, which is opposite the first direction, a display assembly configured to output a screen through the front plate, the display assembly including a display panel and a flexible printed circuit board stacked with the display panel, a bracket disposed between the flexible printed circuit board and the rear plate, the bracket being configured to support internal components, a main printed circuit board disposed between the bracket and the rear plate, and electrically connected to the flexible printed circuit board, a first wireless charging structure disposed on one face of the flexible printed circuit board or inside the flexible printed circuit board, the wireless charging structure including a coil portion and transmission wires electrically connected to the coil portion, and a magnetic plate disposed between the bracket and the flexible printed circuit board, and at least one area of the magnetic plate being disposed to face the first wireless charging structure.

In accordance with another aspect of the disclosure, an electronic device is provided. The electronic device includes a foldable housing including a hinge structure, a first housing connected to the hinge structure, and including a first face that faces a first direction, and a second face that faces a second direction opposite the first direction, a second housing connected to the hinge structure and including a third face that faces a third direction, and a fourth face that faces a fourth direction opposite the third direction, the second housing structure being configured to be folded with the first housing about the hinge structure. In a folded state, the second face may face the fourth face, and, in an unfolded state, the third direction may be the same as the first direction. The electronic device may include a display panel extending from the first housing to the second housing across the hinge structure, the display panel being configured to output a screen through the first face or the third face, a bracket disposed between the first face and the second face within the first housing, the bracket being configured to support internal components, a flexible printed circuit board including a first area electrically connected to the display panel, and a second area extending from the first area and disposed between the display panel and the bracket, a wireless charging structure disposed on one face of the second area or inside the second area, the wireless charging structure including a coil portion and transmission wires electrically connected to the coil portion, and a magnetic plate disposed between the bracket and the flexible printed circuit board, and at least one area of the magnetic plate being disposed to face the wireless charging structure.

With an electronic device including a wireless charging structure (e.g., a structure including a coil for wireless charging) according to this disclosure, it is possible to integrate the wireless charging structure and a shielding structure in an FPCB structure connected to an existing display.

With an electronic device according to this disclosure, it is possible to improve a stack structure, to simplify the structure, and to provide an effect of reducing a material cost by arranging a wireless charging structure for providing RX and TX functions in a display assembly.

With a wireless charging structure according to this disclosure, it is possible provide improved performance and charging efficiency on the front face and/or the rear face of the electronic device including a foldable housing.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 16 illustrates materials disposed on respective end faces when a second area of a flexible printed circuit board is divided into a coil area, a first shielding area connected to one end of a coil area, and a second shielding area connected to other end of the coil area according to an embodiment of the disclosure.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
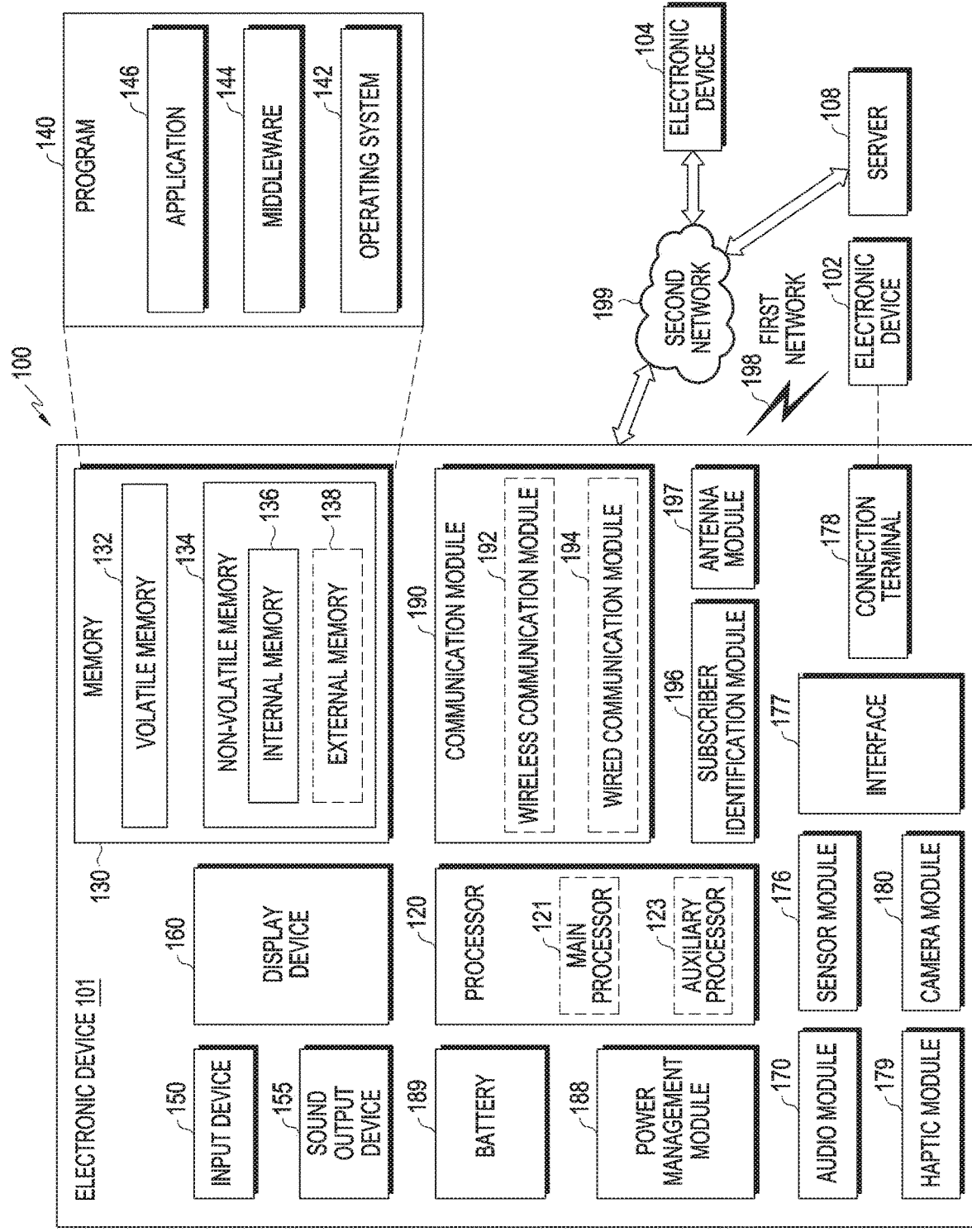
FIG. 1 is a block diagram of an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly.

According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless fidelity (WiFi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities.

According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
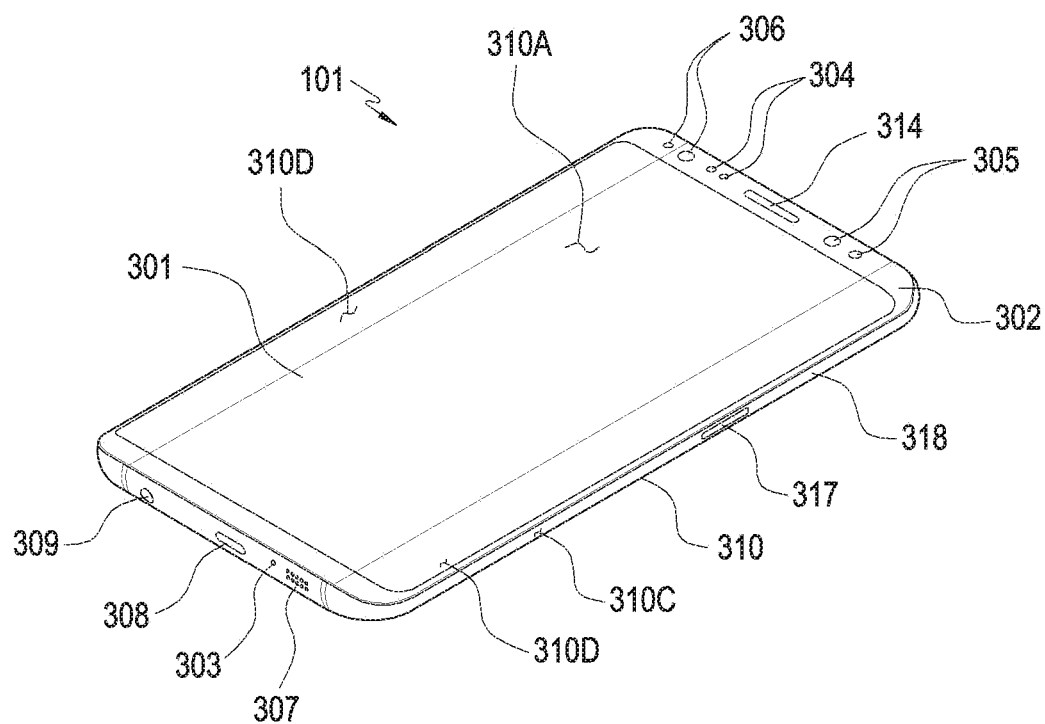
FIG. 2 is a front side perspective view illustrating an electronic device according to an embodiment of the disclosure.

FIG. 2 is a front side perspective view illustrating an electronic device according to an embodiment of the disclosure.

Figure 3:
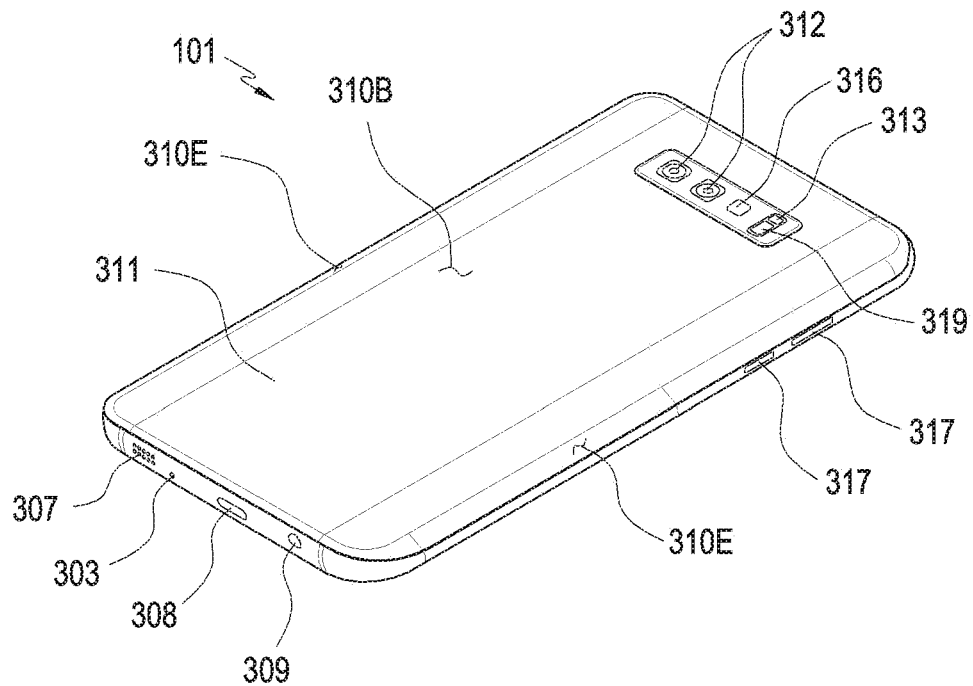
FIG. 3 is a rear side perspective view illustrating an electronic device according to an embodiment of the disclosure.

FIG. 3 is a rear side perspective view illustrating an electronic device according to an embodiment of the disclosure.

Referring to FIGS. 2 and 3, the electronic device 101 according to various embodiments may include a housing 310 including a first face (or a front face) 310A, a second face (or a rear face) 310B, and side faces 310C surrounding the space between the first face 310A and the second face 310B. In another embodiment (not illustrated), the term, housing, may refer to a structure forming a portion of the first face 310A, the second face 310B, and the side faces 310C of FIG. 2. According to an embodiment of the disclosure, at least a portion of the first face 310A may be formed of a substantially transparent front plate 302 (e.g., a glass plate or a polymer plate including various coating layers). The second face 310B may be formed by a substantially opaque rear plate 311. The rear plate 311 may be formed of, for example, coated or colored glass, ceramic, polymer, or metal (e.g., aluminum, stainless steel (STS), or magnesium), or a combination of two or more of these materials. The side face 310C may be formed by a side bezel structure 318 (or a "side member") coupled to the front plate 302 and the rear plate 311 and including a metal and/or a polymer. In some embodiments of the disclosure, the rear plate 311 and the side bezel structure 318 may be integrally formed, and may include the same material (e.g., a metal material, such as aluminum).

In an embodiment of the disclosure, the front plate 302 may include, at the long opposite side edges thereof, two first areas 310D, which are bent from the first face 310A towards the rear plate 311 and extend seamlessly. In the illustrated embodiment (see FIG. 3), the rear plate 311 may include, at the long opposite side edges thereof, two second areas 310E, which are bent from the second face 310B towards the front plate 302 and extend seamlessly. In some embodiments of the disclosure, the front plate 302 (or the rear plate 311) may include only one of the first areas 310D (or the second areas 310E). In an embodiment of the disclosure, some of the first areas 310D and the second areas 310E may not be included. In the embodiments described above, when viewed from a side of the electronic device 101, the side bezel structure 318 may have a first thickness (or width) on the side faces, which do not include the first areas 310D or the second areas 310E, and may have a second thickness (or width), which is smaller than the first thickness, on the side faces, which include the first areas 310D or the second areas 310E.

According to an embodiment of the disclosure, the electronic device 101 may include at least one of a display 301, audio modules 303, 307, and 314, sensor modules 304, 316, and 319, camera modules 305, 312, and 313, key input devices 317, light-emitting elements 306, and connector holes 308 and 309. In some embodiments of the disclosure, at least one of the components (e.g., the key input devices 317 or the light-emitting elements 306) may be omitted from the electronic device 101, or the electronic device 101 may additionally include other components.

According to an embodiment of the disclosure, the display 301 may be exposed through a large portion of, for example, the front plate 302. In some embodiments of the disclosure, at least a portion of the display 301 may be exposed through the front plate 302 forming the first face 310A and the first areas 310D of the side faces 310C. In some embodiments of the disclosure, the edges of the display 301 may be formed to be substantially the same as the shape of the periphery of the front plate 302 adjacent thereto. In another embodiment (not illustrated), the distance between the periphery of the display 301 and the periphery of the front plate 302 may be substantially constant in order to enlarge the exposed area of the display 301.

In another embodiment (not illustrated), a recess or an opening may be formed in a portion of the screen display area of the display 301, and at least one of the audio module 314, the sensor module 304, the camera module 305, and the light-emitting elements 306 may be aligned with the recess or the opening. In another embodiment (not illustrated), the rear face of the screen display area of the display 301 may include at least one of the audio module 314, the sensor module 304, the camera module 305, the fingerprint sensor 316, and the light-emitting elements 306. In another embodiment (not illustrated), the display 301 may be coupled to or disposed adjacent to a touch-sensitive circuit, a pressure sensor that is capable of measuring a touch intensity (pressure), and/or a digitizer that detects a magnetic-field-type stylus pen. In some embodiments of the disclosure, at least some of the sensor modules 304 and 319 and/or at least some of the key input devices 317 may be disposed in the first areas 310D and/or the second areas 310E.

According to an embodiment of the disclosure, the audio modules 303, 307, and 314 may include a microphone hole 303 and speaker holes 307 and 314. The microphone hole 303 may include a microphone disposed therein so as to acquire external sound, and in some embodiments of the disclosure, multiple microphones may be disposed therein so as to detect the direction of sound. The speaker holes 307 and 314 may include an external speaker hole 307 and a phone call receiver hole 314. In some embodiments of the disclosure, the speaker holes 307 and 314 and the microphone hole 303 may be implemented as a single hole, or a speaker may be included therein without the speaker holes 307 and 314 (e.g., a piezo speaker).

According to an embodiment of the disclosure, the sensor modules 304, 316, and 319 may generate an electrical signal or a data value corresponding to an internal operating condition or an external environmental condition of the electronic device 101. The sensor modules 304, 316, and 319 may include, for example, a first sensor module 304 (e.g., a proximity sensor), a second sensor module (not illustrated) (e.g., a fingerprint sensor) disposed on the first face 310A of the housing 310, a third sensor module 319 (e.g., an HRM sensor), and/or a fourth sensor module 316 (e.g., a fingerprint sensor) disposed on the second face 310B of the housing 310. The fingerprint sensor may be disposed not only on the first face 310A (e.g., the display 301) of the housing 310, but also on the second face 310B. The electronic device 101 may further include at least one of sensor modules (not illustrated), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

According to an embodiment of the disclosure, the camera modules 305, 312, and 313 may include, for example, a first camera device 305 disposed on the first face 310A of the electronic device 101, and a second camera device 312 and/or a flash 313 disposed on the second face 310B. The camera modules 305 and 312 may include one or more lenses, an image sensor, and/or an image signal processor. The flash 313 may include, for example, a light-emitting diode or a xenon lamp. In some embodiments of the disclosure, two or more lenses (e.g., an infrared camera lens, a wide-angle lens, and a telephoto lens) and image sensors may be disposed on one face of the electronic device 101.

According to an embodiment of the disclosure, the key input devices 317 may be disposed on the side face 310C of the housing 310. In an embodiment of the disclosure, the electronic device 101 may not include some or all of the above-mentioned key input devices 317, and a key input device 317, which is not included in the electronic device 101, may be implemented in another form, such as that of a soft key or the like, on the display 301. In some embodiments of the disclosure, the key input devices may include a sensor module 316 disposed on the second face 310B of the housing 310.

According to an embodiment of the disclosure, the light-emitting element 306 may be disposed on, for example, the first face 310A of the housing 310. The light-emitting element 306 may provide, for example, the status information of the electronic device 101 in an optical form. In an embodiment of the disclosure, the light-emitting element 306 may provide a light source that is interlocked with, for example, the operation of the camera module 305. The light-emitting element 306 may include, for example, an LED, an IR LED, and a xenon lamp.

According to an embodiment of the disclosure, the connector holes 308 and 309 may include a first connector hole 308 capable of accommodating a connector (e.g., a USB connector) for transmitting/receiving power and/or data to/from an external electronic device, and/or a second connector hole 309 capable of accommodating a connector (e.g., an earphone jack) for transmitting/receiving an audio signal to/from an external electronic device.

Figure 4:
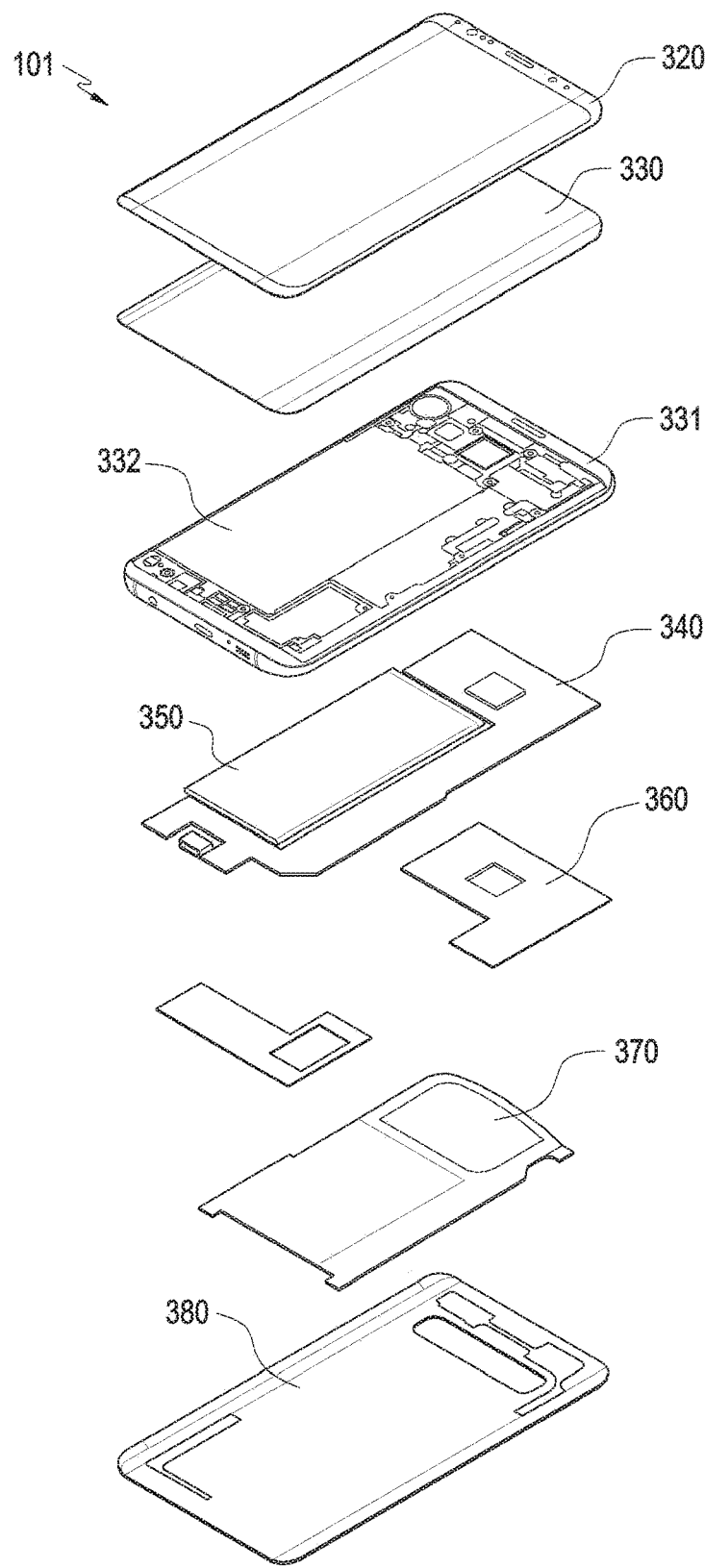
FIG. 4 is an exploded perspective view illustrating an electronic device according to an embodiment of the disclosure.

FIG. 4 is an exploded perspective view illustrating an electronic device according to an embodiment of the disclosure.

Referring to FIG. 4, an electronic device 101 (e.g., the electronic device 101 in FIGS. 1 to 3) may include a side bezel structure 331, a first support member 332 (e.g., a bracket), a front plate 320, a display 330, a printed circuit board 340, a battery 350, a second support member 360 (e.g., a rear case), an antenna 370, and a rear plate 380. In some embodiments of the disclosure, at least one of the components (e.g., the first support member 332 or the second support member 360) may be omitted from the electronic device 101, or the electronic device 101 may additionally include other components. At least one of the components of the electronic device 101 may be the same as or similar to at least one of the components of the electronic device 101 of FIG. 2 or 3, and a redundant description thereof is omitted below.

According to an embodiment of the disclosure, the first support member 332 may be disposed inside the electronic device 101, and the first support member 332 may be connected to the side bezel structure 331, or may be integrally formed with the side bezel structure 331. The first support member 332 may be formed of, for example, a metal material and/or a non-metal (e.g., a polymer) material. The display 330 may be coupled to one face of the first support member 332, and the printed circuit board 340 may be coupled to the other face of the first support member 332. On the printed circuit board 340, a processor, memory, and/or an interface may be mounted. The processor may include at least one of, for example, a central processing unit, an application processor, a graphic processor, an image signal processor, a sensor hub processor, or a communication processor.

According to an embodiment of the disclosure, the memory may include, for example, volatile memory or nonvolatile memory.

According to an embodiment of the disclosure, the interface may include, for example, a high-definition multimedia interface (HDMI), a universal serial bus (USB) interface, an SD card interface, and/or an audio interface. The interface may electrically or physically connect, for example, the electronic device 101, to an external electronic device, and may include a USB connector, an SD card/an MMC connector, or an audio connector.

According to an embodiment of the disclosure, the battery 350 is a device for supplying power to at least one component of the electronic device 101, and may include, for example, a non-rechargeable primary battery, a rechargeable secondary battery, or a fuel cell. At least a portion of the battery 350 may be disposed to be substantially flush with, for example, the printed circuit board 340. The battery 350 may be integrally disposed within the electronic device 101, or may be detachably mounted on the electronic device 101.

According to an embodiment of the disclosure, the antenna 370 may be disposed between the rear plate 380 and the battery 350. The antenna 370 may include, for example, a nearfield communication (NFC) antenna, a wireless charging antenna, and/or a magnetic secure transmission (MST) antenna. The antenna 370 may perform short-range communication with, for example, an external electronic device, or may transmit/receive power required for charging to/from the external device in a wireless manner. In an embodiment of the disclosure, an antenna structure may be formed by the side bezel structure 331, a portion of the first support member 332, or a combination thereof.

Figure 5:
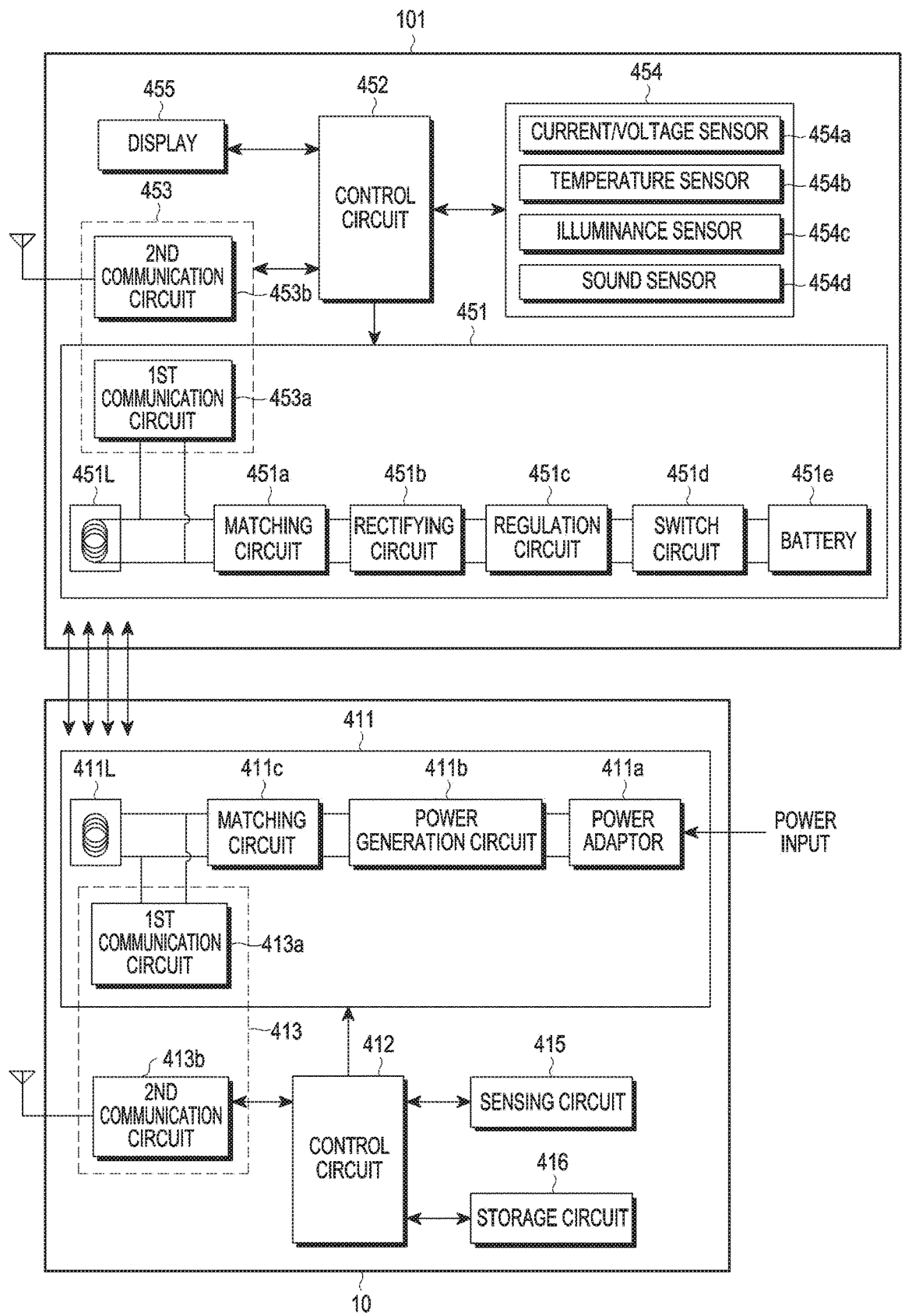
FIG. 5 is a block diagram of a wireless charging system according to an embodiment of the disclosure.

FIG. 5 is a block diagram of a wireless charging system according to an embodiment of the disclosure.

Referring to FIG. 5, a wireless charging system according to an embodiment may include an external electronic device 10 configured to transmit wireless power and a wireless power transmission/reception device 101 (e.g., the electronic device 101 in FIG. 1) configured to receive wireless power transmitted from the external electronic device 10.

The external electronic device 10 according to an embodiment may include a circuit board including various circuit units. The circuit board may include a power transmission/reception circuit 411, a control circuit 412, a communication circuit 413, a sensing circuit 415, and a storage circuit 416. The wireless power transmission/reception device 101 may include a power transmission/reception circuit 451, a control circuit 452, a communication circuit 453, a sensing circuit 454, and a display 455.

According to various embodiments of the disclosure, the power transmission/reception circuit 411 may provide power required from the wireless power transmission/reception device 101 to receive power and may include a loop coil 411L formed of a conductive pattern. The power transmission/reception circuit 411 may be provided to wirelessly transmit power to the wireless power transmission/reception device 101 through the loop coil 411L. Here, the power transmission/reception circuit 411 may receive power in the form of a DC or AC signal from the outside (e.g., a power input), and may supply the received power to the wireless power transmission/reception device 101 in the form of an AC signal. For example, when receiving power supplied from the outside in the form of a DC signal, the power transmission/reception circuit 411 may convert the power in the form of the DC signal into an AC signal using a power inverter, and may supply the power to the wireless power transmission/reception device 101 in the form of the AC signal. As another example, when receiving power wirelessly supplied from the outside, the power transmission/reception circuit 411 may rectify the power in the form of an AC signal into a DC signal using a rectifier. The rectified power may be delivered to a charger or PMIC for charging a battery.

According to various embodiments of the disclosure, the power transmission/reception circuit 411 may provide an AC signal to the wireless power transmission/reception apparatus 101 as a frequency resonance signal. The power transmission/reception circuit 411 may include a loop coil 411L formed of a conductive pattern, and may transmit or receive a predetermined frequency resonance signal generated when a current is applied to the loop coil 411L, using an electromagnetic induction scheme or a resonance scheme. The power transmission/reception circuit 411 may additionally include a first communication circuit 413a (e.g., a resonance circuit), and may perform communication (e.g., data communication) in an in-band format using a frequency resonance signal generated by the loop coil 411L. The first communication circuit 413a will be described in more detail in the communication circuit 413, which will be described later. When the power transmission/reception circuit 411 is implemented as a resonance circuit, the inductance L of the loop coil 411L of the resonance circuit may be variable.

In addition, the power transmission/reception circuit 411 may be implemented in the form of a power reception interface, which receives power from the outside and supplies the power to other components. The power transmission/reception circuit 411 may further include, for example, a power adaptor 411a, a power generation circuit 411b, and a matching circuit 411c in addition to the loop coil 411L.

According to various embodiments of the disclosure, the power adaptor 411a may receive AC or DC power input from the outside or may receive a power signal of a battery device, and may output a DC signal having a predetermined voltage value. The voltage value of the DC signal output from the power adaptor 411a may be controlled by the control circuit 412. The DC signal output from the power adaptor 411a may be output to the power generation circuit 411b.

According to various embodiments of the disclosure, the power generation circuit 411b may convert the DC signal output from the power adaptor 411a into an AC signal, and may output the AC signal. The power generation circuit 411b may include a predetermined amplifier (not illustrated). When the DC signal input through the power adaptor 411a is lower than a predetermined intensity, the power generation circuit 411b may amplify the DC signal to a predetermined intensity using the amplifier. In addition, the power generation circuit 411b may further include a circuit for converting a DC signal input from the power adaptor 411a into an AC signal based on a control signal input from the control circuit 412. For example, the power generation circuit 411b may convert the DC signal into an AC signal using a predetermined inverter. Alternatively, the power generation circuit 411b may further include a gate drive device (not illustrated), and the gate drive device may change the DC signal to an AC signal while controlling the DC signal by turning on/off the DC signal.

According to various embodiments of the disclosure, the matching circuit 411c may perform an impedance control operation. For example, when an AC signal output from the power generation circuit 411b is delivered to the loop coil 411L, an electromagnetic field may be formed in the loop coil 411L by the AC signal. At this time, the matching circuit 411c may adjust the frequency band of the received electromagnetic field signal through an impedance adjustment. Through this regulation, the matching circuit 411c may regulate, for example, the impedance viewed from, for example, the matching circuit 411c transmitted to the wireless power transmission/reception device 101 through the loop coil 411L so as to perform control such that the output signal power becomes a high output. The matching circuit 411c may regulate the impedance based on the control of the control circuit 412. The matching circuit 411c may include at least one of an inductor (e.g., a coil), a capacitor, and a switch device. The control circuit 412 may control the connection state to at least one of the inductor and the capacitor through the switch device, thereby making the matching circuit 411c perform an impedance changing operation.

A person ordinarily skilled in the art will readily understand that the power transmission/reception circuit 411 is not limited thereto and may include any means capable of transmitting and receiving electromagnetic waves.

According to various embodiments of the disclosure, the sensing circuit 415 may sense a change in the amount of power to be transmitted to the wireless power transmission/reception device 101. In the external electronic device 10, an amount of transmission power to be transmitted to the wireless power transmission/reception device 101 may be generated in response to the magnitude of current/voltage applied to the loop coil 411L, and the sensing circuit 415 may sense the amount of transmission power. For example, in the electronic device 10, the amount of power to be transmitted may vary depending on the change in the current/voltage of the signal output through the loop coil 411L. For example, as the magnitude of the current/voltage applied to the loop coil 411L increases, the amount of transmission power to be transmitted may increase, and as the magnitude of the current/voltage applied to the loop coil 411L decreases, the amount of transmission power to be transmitted may decrease.

According to an embodiment of the disclosure, the sensing circuit 415 (e.g., a temperature sensor (thermistor)) may sense the temperature change of the external electronic device 10. The sensing circuit 415 may generate power to be transmitted by the power transmission/reception circuit 411, or may sense a temperature change caused by heat, which may be generated by the electronic device 10 during the transmission of the generated power to the wireless power transmission/reception device 101. For example, the sensing circuit 415 may measure at least one of the internal temperature and the external temperature of the external electronic device 10. According to an embodiment of the disclosure, the sensing circuit 415 may include at least one of a current sensor, a voltage sensor, and a temperature sensor.

The current sensor may be implemented with, for example, a charge counter (e.g., a Coulomb counter), but there is no limit to the aspect of implementation. The voltage sensor is not limited in the type thereof as long as the voltage sensor is a voltmeter capable of measuring the voltage of the wireless power transmission/reception device 101.

According to various embodiments of the disclosure, the control circuit 412 may control the overall operation of the external electronic device 10. The control circuit 412 may control the overall operation of the external electronic device 10 using an algorithm, a program, or an application required for control and stored in the storage circuit 416. In addition, the control circuit 412 may perform control to wirelessly transmit power to the wireless power transmission/reception device 101 through the power transmission/reception circuit 411. The control circuit 412 may perform control to wirelessly receive information from the wireless power transmission/reception device 101 through the communication circuit 413.

According to various embodiments of the disclosure, the communication circuits (the first communication circuit 413a and a second communication circuit 413b) (e.g., the interface 177 and the communication module 190 in FIG. 1) may communicate with the wireless power transmission/reception device 101 in a predetermined manner. The communication circuit 413 may perform data communication with the communication circuit 453 of the wireless power transmission/reception device 101.

Meanwhile, the communication circuit 413 may transmit a signal for information of the external electronic device 10 to the wireless power transmission/reception device 101. Here, the communication circuit 413 may unicast, multicast, or broadcast the signal. In addition, the communication circuit 413 may transmit a charging function control signal for controlling the charging function of the wireless power transmission/reception device 101. The charging function control signal may be a control signal that controls the power transmission/reception circuit 451 of a specific electronic device (e.g., the wireless power transmission/reception device 101) so as to enable or disable the charging function.

Meanwhile, the communication circuit 413 may receive/transmit a signal from/to other wireless power transmission/reception devices (not illustrated) as well as the wireless power transmission/reception device 101.

The communication circuit 413 according to an embodiment may include at least one of, for example, a first communication circuit 413a implemented as one piece of hardware with the power transmission/reception circuit 411 so as to allow the external electronic device 10 to perform communication in an in-band format, and a second communication circuit 413b implemented in hardware different from the power transmission/reception circuit 411 so as to allow the external electronic device 10 to perform communication in an out-of-band format.

For example, when the communication circuit 413 includes the first communication circuit 413a in which communication is capable of being performed in the in-band format, the first communication circuit 413a may receive an electromagnetic field signal having a predetermined frequency and signal level through the loop coil 411L of the power transmission/reception circuit 411. In this case, the control circuit 412 may extract information received from the wireless power transmission/reception device 101 by decoding the electromagnetic signal having the predetermined frequency and the signal level. In addition, the first communication circuit 413a may apply a signal for information to be transmitted to the loop coil 411L of the power transmission/reception circuit 411. For example, the first communication circuit 413*a* may add a signal for information to be transmitted to a signal output from the matching circuit 411*c*. In this case, the control circuit 412 may perform control such that the connection state with at least one of the inductor and the capacitor of the matching circuit 411*c* through the on/off control of the switching device included in the matching circuit 411*c*. For example, the control circuit 412 may perform on/off keying encoding. The magnitude of the power output through the loop coil 451L of the wireless power transmission/reception circuit 101 (e.g., the voltage at the output terminal of the rectifier) may vary in response to the on/off control, and the wireless power transmission/reception device 101 may decode this in an on/off keying manner so as to acquire information.

For example, when the communication circuit 413 includes the second communication circuit 413*b* capable of performing communication in the out-of-band format, the second communication circuit 413*b* may communicate with the communication circuit 453 (e.g., a first communication circuit 453*a* and a second communication circuit 453*b*) of the wireless power transmission/reception device 101 using nearfield communication (NFC), ZigBee communication, infrared communication, visible light communication, Bluetooth low energy (BLE) communication, or the like.

Meanwhile, the above-mentioned communication schemes of the communication circuit 413 are merely examples, and the embodiments disclosed herein are not limited to a specific communication scheme performed by the communication circuit 413.

In addition, the communication circuit 413 may transmit a charging function control signal for controlling the charging function of the wireless power transmission/reception device 101. The charging function control signal may be a control signal that controls the power transmission/reception circuit 451 of the wireless power transmission/reception device 21 or 22 to enable or disable the charging function.

The communication circuit 413 may receive not only a signal from the wireless power transmission/reception device 101, but also a signal from other wireless power transmission devices (not illustrated). For example, the communication circuit 413 may be configured as hardware different from the power transmission/reception circuit 411, and thus the external electronic device 10 may perform communication in the out-of-band format. However, this is merely an example. The power transmission/reception circuit 411 and the communication circuit 413 may be implemented as one piece of hardware, and thus the external electronic device 10 may perform communication in an in-band format.

The external electronic device 10 and the wireless power transmission/reception device 101 may transmit/receive various signals through the respective communication circuits 413 and 453 thereof.

In addition, according to various embodiments of the disclosure, the electronic device 10 may be a portable terminal including the power transmission/reception circuit 411 and a battery. Accordingly, the external electronic device 10, which is a portable terminal, may transmit the power stored in the battery to the wireless power transmission/reception device 101 as wireless power. In addition, according to various embodiments of the disclosure, the external electronic device 10 is not limited to a wireless charger or a portable terminal, and may be various electronic devices including the power transmission/reception circuit 411.

Meanwhile, the power transmission/reception circuit 451 of the wireless power transmission/reception device 101 according to an embodiment may receive power from the power transmission/reception circuit 411 of the external electronic device 10. The power transmission/reception circuit 451 may be implemented in the form of a power reception interface so as to receive power from the outside. The power transmission/reception circuit 451 may include a loop coil 451L made of a conductive pattern. The power transmission/reception circuit 451 may receive, through the loop coil 451L, the wireless power in the form of electromagnetic waves generated in response to the current/voltage applied to the loop coil 411L of the power transmission/reception circuit 411 of the external electronic device 10. For example, the power transmission/reception circuit 451 may receive, from the power transmission/reception circuit 411 of the external electronic device 10, power supplied to the loop coil 451L of the adjacent power transmission/reception circuit 451 by generating induced electromotive force by power applied to the loop coil 411L of the power transmission/reception circuit 411 in the form of an AC waveform. For example, the power transmission/reception circuit 451 may receive, through the loop coil 451L, the wireless signal power in the form of electromagnetic waves generated in response to the current/voltage applied to the loop coil 411L of the power transmission/reception circuit 411 of the external electronic device 10.

The power transmission/reception circuit 451 may further include, for example, a matching circuit 451*a*, a rectifying circuit 451*b*, a regulation circuit (regulator) 451*c*, a switch circuit 451*d*, and a battery 451*e*, in addition to the loop coil 451L.

The matching circuit 451*a* may perform an impedance control operation. For example, the signal power transmitted through the loop coil 411L of the external electronic device 10 may be delivered to the loop coil 451L so as to form an electromagnetic field. In this case, the matching circuit 451*a* may regulate the frequency band of the formed electromagnetic field signal so as to regulate the impedance viewed from the matching circuit 451*a*. Through this regulation, the matching circuit 451*a* may perform control such that the input power received from the external electronic device 10 through the loop coil 451L is improved in efficiency and output. The matching circuit 451*a* may regulate the impedance based on the control of the control circuit 452. The matching circuit 451*a* may include at least one of an inductor (e.g., a coil), a capacitor, and a switch device. The control circuit 452 may control the connection state with at least one of the inductor and the capacitor through the switch device, thereby performing an impedance control operation.

The rectifying circuit 451*b* may rectify the wireless signal power received by the loop coil 451L as a DC signal, and may be implemented, for example, in the form of a rectifier circuit including a bridge diode.

The regulation circuit 451*c* may convert the intensity of the rectified signal to a predetermined intensity. The regulation circuit 451*c* may include a predetermined DC/DC converter (not illustrated) (e.g., a buck converter). For example, the regulation circuit 451*c* may convert the rectified power such that the voltage at the output terminal becomes 5V. Meanwhile, the applicable minimum and maximum values of the voltage may be preset at the previous stage of the regulation circuit 451*c*.

The switch circuit 451*d* is able to connect the regulation circuit 451*c* and the battery 451*e*. The switch circuit 451*d* may maintain the on/off state under the control of the control circuit 452.

When the switch circuit 451d is in the on state, the battery 451e may be charged with power supplied from the regulation circuit 451c.

The sensing circuit 454 may sense a change in the charging state of the wireless power transmission/reception device 101. For example, the sensing circuit 454 may periodically or non-periodically measure the current/voltage value of a signal received by the loop coil 451L using a predetermined current/voltage sensor 454a. The wireless power transmission/reception device 101 may calculate the amount of power received by the wireless power transmission/reception device 101 based on the measured current/voltage.

The sensing circuit 454 may sense a change in the charging environment of the wireless power transmission/reception device 101. For example, the sensing circuit 454 may periodically or non-periodically measure at least one of the internal temperature and the external temperature of the wireless power transmission/reception device 101 using a predetermined temperature sensor 454b. The sensing circuit 454 may periodically or non-periodically measure the illuminance (brightness) around the wireless power transmission/reception device 101 using a predetermined illuminance sensor 454c. The sensing circuit 454 may periodically or non-periodically measure the sound (noise) level around the wireless power transmission/reception device 101 using a predetermined sound sensor 454d.

Figure 6A:
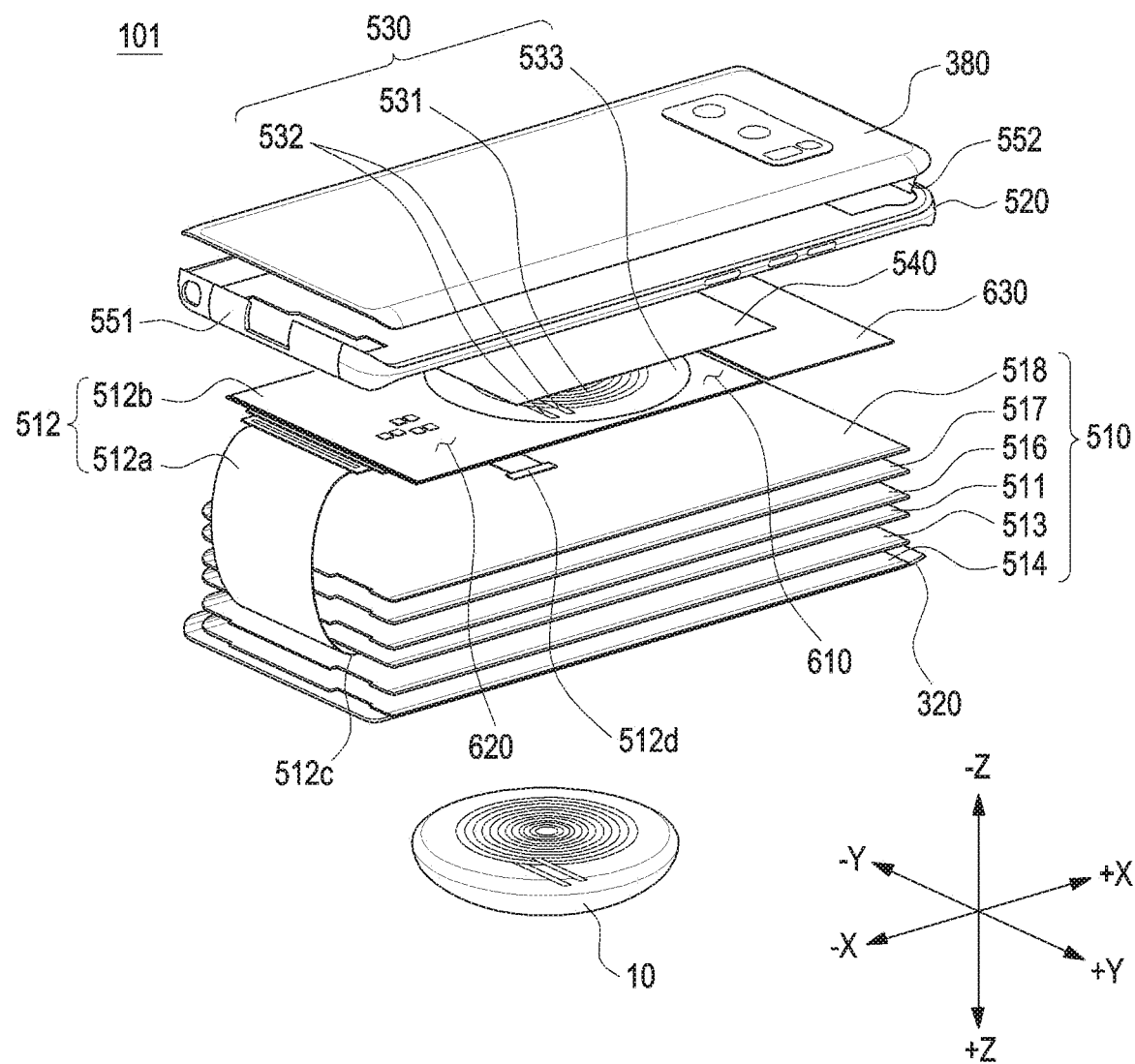
FIGS. 6A and 6B are perspective views illustrating a stack structure of an electronic device according to various embodiments of the disclosure.
Figure 6B:
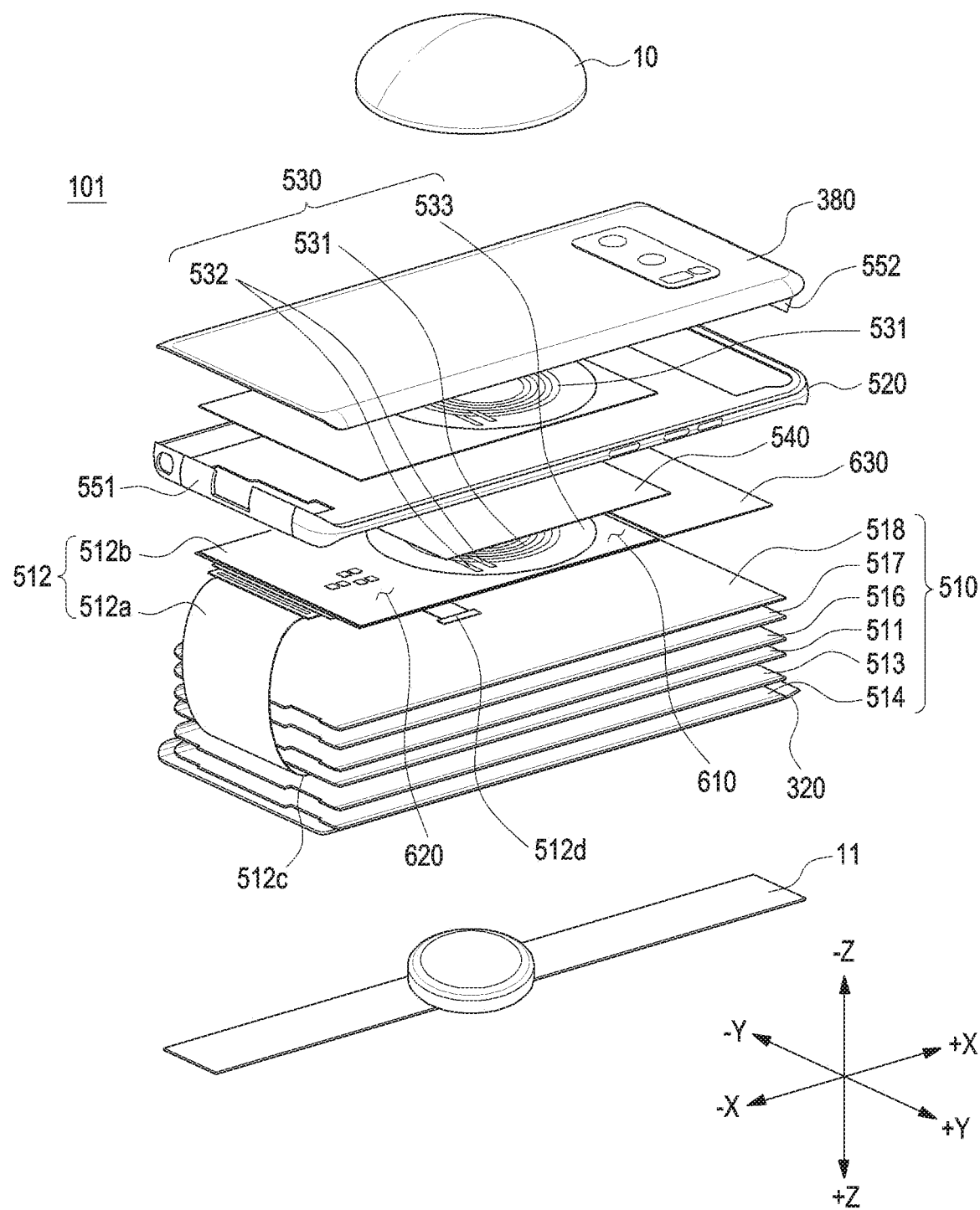

FIGS. 6A and 6B are perspective views illustrating a stack structure of an electronic device according to various embodiments of the disclosure.

Referring to FIGS. 6A and 6B, according to various embodiments of the disclosure, an electronic device 101 (e.g., the electronic device 101 of FIGS. 1 to 4) may include a front plate 320, a rear plate 380, a display assembly 510, a bracket 520, a wireless charging structure 530, and a magnetic plate 540. As another example, the electronic device 101 may include a first antenna 551 or a second antenna 552 formed in at least one area of the bracket 520.

In FIGS. 6A and 6B, the "X axis" in an orthogonal coordinate system of three axes may correspond to the length direction of the electronic device 101, the "Y axis" may correspond to the width direction of the electronic device 101, and the "Z axis" may correspond to the thickness direction of the electronic device 101. In addition, in an embodiment of the disclosure, the upper side of the electronic device 101 may correspond to a first direction (+Z), the lower side may correspond to a second direction (−Z), the front side of the electronic device 101 may correspond to a third direction (+X), and the rear side may correspond to the fourth direction (−X).

The structure of the front plate 320, the rear plate 380, the display assembly 510, and the bracket 520 in FIGS. 6A and 6B may be partially or wholly the same as the structure of the front plate 320, the rear plate 380, the display 330, the side bezel structure 331, and the first support member 332 (e.g., a bracket) in FIG. 4.

According to various embodiments of the disclosure, the front plate 320 may be disposed to face in the first direction (+Z), and the rear plate 380 may be disposed to face in the second direction (−Z) opposite the first direction (+Z). The front plate 320 may be a member made of a transparent material, and may include an active area in which an image and/or video are substantially provided to a user through the display assembly 510 and an inactive area extending from the active area to an edge of the front plate 320. Under the active area of the front plate 320, the display assembly 510 may be disposed in a flat state, and under the inactive area, at least a portion of the display assembly 510 (e.g., a first area 512a of the flexible printed circuit board 512) may be disposed in a bent state. Under the nonactive area, a non-conductive material of an opaque material may be applied such that internal electronic components, signal lines, or circuit lines are not visible from the outside.

According to various embodiments of the disclosure, the bracket 520 may be disposed between the rear plate 380 and the display assembly 510, and at least a portion of the side face thereof may form the first antenna 551 or the second antenna 552. For example, the rear end portion of the bracket 520 may form the first antenna 551, and the front end portion of the bracket 520 may form the second antenna 552.

According to various embodiments of the disclosure, the display assembly 510 may include a display panel 511 stacked with the front plate 320 and including one or more display pixels and a substrate electrically connected to the one or more display pixels, and a flexible printed circuit board 512 extending from the display panel 511 and at least partially bent. As another example, the display assembly 510 may include an optical layer 513 and a dielectric layer 514 disposed on the display panel 511 in the first direction (+Z). As another example, the display assembly 510 may include a plurality of layers (e.g., an embossing layer and a cushion) on the display panel 511 in the second direction (−Z). As another example, the display assembly 510 may include a digitizer panel configured to detect a magnetic-field-type stylus pen.

According to various embodiments of the disclosure, the display panel (e.g., an (active) organic light-emitting diode) 511 is visible to the outside through the transparent front plate 320, and may include a display element layer including the one or more pixels and a TFT layer connected to the display element layer. According to an embodiment of the disclosure, an optical member and/or a touch plate 302 may be mounted between the front plate 320 and the display element layer or inside the display element layer. For example, the flexible display 511 may be an output device configured to output a screen, and may be utilized as an input device having a touch screen function. When the display panel 511 has a touch screen function, the display panel may correspond to an indium-tin oxide (ITO) film or a touch sensor panel for sensing the user's touch position or the like. As another example, a dielectric layer (not illustrated) may be disposed between the display element layer and the touch sensor panel.

According to various embodiments of the disclosure, the optical layer 513 disposed on one face of the display panel 511 or disposed inside the display panel 511 may transmit a screen output from the display panel 511. For example, the optical layer 513 may include an optical compensation film or the like for correcting a phase difference or the like of the screen output from the display element layer. The optical layer 513 may include an optical compensation film (e.g., a polarizing film). In the optical compensation film, tri-acetyl cellulose (TAC) films are respectively attached to the opposite sides of a polyvinyl alcohol (PVA) film, which provides a polarizing function, and the surface side TAC film may be protected by a surface coating layer.

According to various embodiments of the disclosure, a dielectric layer 514 may be provided between the front plate 320 and the display panel 511. The dielectric layer 514 may be disposed to be in contact with the front plate 320, and may include, for example, silicon, air, foam, membrane, optically clear adhesive (OCA), rubber, ink, or a polymer (PC or PET). The dielectric layer 514 may be provided so as to attach the front plate 320 and/or the optical layer 513 or to have a refractive index different from that of the front plate 320 and/or that of the optical layer 513.

According to various embodiments of the disclosure, a plurality of layers may be disposed under the display panel 511 (e.g., in the second direction (−Z)). For example, a polymer layer 516, a light-shielding member, and/or a heat dissipation layer may be sequentially disposed. The light-shielding member may be provided as a layer shielding the rear face of the display panel 511. The light-shielding layer may be, for example, an embossing member 517, a cushion member 518, or a copper (Cu) sheet, and may include black color. As another example, the heat dissipation layer may block heat generated from the display panel 511 or may block heat generated by electronic components, such as a wireless communication circuit mounted on the main printed circuit board so as not to be transferred to the display panel 511.

According to various embodiments of the disclosure, the flexible printed circuit board 512 of the display assembly 510 may be electrically connected to the display panel 511, and may include a first area 512a electrically connected to the display panel 511 and at least partially bent, and a second area 512b extending from the first area 512a and disposed between the bracket 520 and the display panel 511. For example, the second area 512b may be disposed to face the active area of the front plate 320, and the first area 512a may be disposed to face the inactive area of the front plate 320.

According to an embodiment of the disclosure, the flexible printed circuit board 512 may include a first connector 512c and a second connector 512d disposed to be spaced apart from each other. For example, the first connector 512c disposed at an end of the first area 512a of the flexible printed circuit board 512 may be directly connected to the display panel 511 of the display assembly 510, and the second connector 512d disposed in the second area 512b may be electrically connected to the main printed circuit board 340.

According to an embodiment of the disclosure, a wiring layer (not illustrated) extending from the display panel 511 may be disposed on the flexible printed circuit board 512. For example, on the flexible printed circuit board 512, wires of a display, a touch sensor, a fingerprint sensor, a pressure sensor, an optical sensor, or an EMR sensor may be disposed. As another example, the flexible printed circuit board 512 may include a display driver circuit (display driver IC) and/or a touch sensor panel IC (TSP-IC). The wiring layer may include a chip-on-film or a tape carrier package having a flexible printed circuit film or a drive chip. The wiring layer may be connected, via the connector, to a printed circuit board (e.g., the printed circuit board 340 in FIG. 4) in which a control circuit is formed. The display driver circuit is electrically connected to a control circuit of a circuit board (e.g., the printed circuit board 340 of FIG. 4), and the control circuit is interlocked with the display driver circuit so as to receive and process image data or image information including an image control signal corresponding to a command for controlling the image data so as to allow visual information (e.g., text, an image or an icon) to be displayed through the display panel 511.

According to an embodiment of the disclosure, the first area 512a of the flexible printed circuit board 512 may extend from the rear end of the display panel 511, and may be bent toward the rear plate 380 (e.g., in the second direction (−Z)) so as to be connected to the second area 512b. The second area 512b of the flexible printed circuit board 512 is provided substantially in a plate shape, and the length of the second area 512b may substantially extend from the rear end portion of the electronic device 101 to the center area of the electronic device 101.

According to an embodiment of the disclosure, a portion of the second area 512b may include a coil area 610 in which the wireless charging structure 530 may be disposed. For example, the coil area 610 in which the wireless charging structure 530 is disposed may be positioned to face the center area of the electronic device 101. As another example, the coil area 610 in which the wireless charging structure 530 is disposed may include a recessed shape. The coil area 610 may be provided in a shape corresponding to the shape of the wireless charging structure. For example, the coil area may have a shape of a groove or an opening into which the wireless charging structure 530 including a circular coil is insertable. As another example, the coil area 610 in which the wireless charging structure 530 is disposed may be integrally configured by being disposed in at least some or all of the layers of the flexible printed circuit board formed of a plurality of conductive layers. Accordingly, when viewed from the cross section of the second area 512b of the flexible printed circuit board 512, the wireless charging structure 530 does not substantially protrude above or below the second area 512b. Since no operation occurs, an additional height compensation structure may be excluded.

According to an embodiment of the disclosure, the second area 512b may extend to the front end (e.g., in the +X direction) or the rear end (e.g., in the −X direction) of the electronic device 101. In the second area 512b, the area except for the coil area 610 and/or the wiring area in which the wiring or electronic components are disposed may be configured as a shielding area 620. The shielding area 620 may be formed in an area facing the first antenna 551 so as to prevent TX power or baseband noise of the first antenna 551 from flowing into a sensor of the display panel 511 (e.g., a touch sensor or a digitizer), thereby suppressing sensor malfunction. As another example, the shielding area 620 may be disposed in the rear end portion of the second area 512b, and a separate shielding member 630 for preventing the inflow of electromagnetic waves of the second antenna 552 may be disposed in the front end portion of the electronic device 101 other than the second area 512b. The shielding member 630 may be coplanar with the flexible printed circuit board 512, and may include the same material as the shielding material (e.g., copper) of the shielding area 620.

According to various embodiments of the disclosure, the wireless charging structure 530 of the electronic device 101 may include at least one coil, and may be disposed in the coil area 610 of the flexible printed circuit board 512. The wireless charging structure 530 disposed in at least one area of the coil area 610 may have a flat face as a whole.

According to an embodiment of the disclosure, the wireless charging structure 530 may be disposed between the front plate 320 and the bracket 520. The wireless charging structure 530 may include a coil portion 531 including at least one coil, transmission wires 532 extending from the coil portion 531 to be connected to the main printed circuit board, and a core portion 533 formed to surround at least a portion of the coil portion 531 and the transmission wires 532. For example, at least a portion of the core portion 533 may have an opening shape formed inside the second area 512b, and the coil portion 531 and the transmission wires may be inserted into the core portion 533. In addition, the wireless charging structure 530 may include a control circuit configured to wirelessly transmit power using the coil portion 531.

According to an embodiment of the disclosure, the coil portion 531 may include at least one coil, and the at least one coil may form one layer wound in a predetermined first shape by a first turn number. For example, one coil may be wound in the same direction to provide a current flow in the same direction. The one coil may be provided in the form in which an opening is provided in the inner center thereof, and wires (e.g., the power transmission wires 532) extending from the inner diameter end portion and/or the outer diameter end portion thereof may be electrically connected to the main circuit board 340. As another example, the at least one coil may be disposed such that a plurality of layers may be stacked on respective conductive layers of the flexible printed circuit board 512 and may be electrically connected through vias. As another example, the coil portion 531 may include a plurality of coils, and respective coils may be implemented in different turn numbers and different shapes. According to an embodiment of the disclosure, at least one coil of the coil portion 531 may be a coil conforming to the WPC standard. As another example, a ferrite composite sheet for concentrating magnetic fluxes may be attached to the center of the coil portion 531, and the composite sheet may be formed in a circular shape so as to correspond to the shape of the coil portion 531.

According to an embodiment of the disclosure, the transmission wires 532 are wires extending from the at least one coil, and a component (e.g., a coaxial cable connector, a board-to-board (B-to-B) connector, a C-clip, or a short pad) for electrical connection with the main printed circuit board 340 may be provided at each of the end portions of the transmission wires 532. For example, the transmission wires 532 extending from one coil may be connected to a source of the main printed circuit board 340 so as to provide terminals capable of receiving power.

According to an embodiment of the disclosure, the core portion 533 may provide a space for forming a magnetic path, which is a path through which magnetic fluxes induced by an internal electrode pass as current is applied thereto through the transmission wires 532. The core portion 533 may be formed of a ceramic material, a ferrite material, or a combination thereof having a high permeability. As another example, the core portion 533 may include a material of a metal alloy. However, the core portion 533 is not limited thereto, and may be changed or modified as long as it is capable of forming a magnetic path in response to the application of current from the transmission wires 532 and is made of made of a material having a high permeability.

According to an embodiment of the disclosure, the wireless charging structure 530 may be disposed on the flexible printed circuit board 512 to be oriented toward the front plate 320. When the coil area of the flexible printed circuit board 512 is formed to have a shape opened toward the front plate 320, one face of the wireless charging structure 530 disposed in the coil area may directly face the display assembly 510. However, the arrangement of the wireless charging structure 530 is not limited thereto. When the coil area of the flexible printed circuit board 512 is opened toward the rear plate 380, one face of the wireless charging structure 530 disposed in the coil area may directly face the magnetic plate 540.

According to an embodiment of the disclosure, there may be provided a plurality of wireless charging structures. For example, referring to FIG. 6B, the wireless charging structures may include a first wireless charging structure 530 disposed between the front plate 320 and the bracket 520, and a second wireless charging structure 530 disposed between the rear plate 380 and the bracket 520. The second wireless charging structure 530 may receive, via the rear plate 380, energy transferred from the charging device 10. For example, the rear plate 380 of the electronic device 101 may face the charging device 10, and the charging device 10 may transfer energy toward the second wireless charging structure 530. The first wireless charging structure 530 may provide the generated energy to a charging receiving device 11 via the front plate 320. For example, the rear plate 380 of the electronic device 101 may face the charging receiving device 11, and the charging receiving device 11 may receive energy via the second wireless charging structure 530.

According to an embodiment of the disclosure, the electronic device 101 may transfer energy to an external electronic device via the first wireless charging device 530, and may receive energy from an external electronic device via the second wireless charging device 531. The first wireless charging device 530 and the second wireless charging device 531 may operate simultaneously or separately.

According to various embodiments of the disclosure, the magnetic plate 540 of the electronic device 101 may be disposed between the bracket 520 and the flexible printed circuit board 512. For example, the magnetic plate 540 may be formed to be stacked in the area in which the wireless charging structure 530 may be disposed so as to improve charging efficiency of the wireless charging structure 530 and to lower surface heat generation. For example, when a conductive member (e.g., the bracket 520) is directly disposed on the rear face of the wireless charging structure 530, eddy current may be generated and thus the energy generated by the charging device 10 is not transferred, which may result in efficiency reduction. In contrast, by disposing a magnetic plate 540 having a magnetic property of inducing magnetic fluxes between the bracket 520 and the wireless charging structure 530, it is possible to increase the inflow amount of magnetic fluxes and to prevent interference of the bracket 520.

According to an embodiment of the disclosure, the magnetic plate 540 is provided as a sheet paper of about 0.2 mm or less, and may be manufactured in a size capable of covering the wireless charging structure 530. For example, when the wireless charging structure 530 is provided in a circular shape, the magnetic plate 540 may be provided in a circular shape having a size corresponding to the wireless charging structure 530, or in a rectangular size having a size covering the wireless charging structure 530.

According to various embodiments of the disclosure, the electronic device 101 may include a heat dissipation sheet in order to suppress surface heat generation caused by the coil component of the wireless charging structure 530. The heat dissipation sheet may be stacked with the magnetic plate 540, and may include, for example, a graphite sheet.

Figure 7:
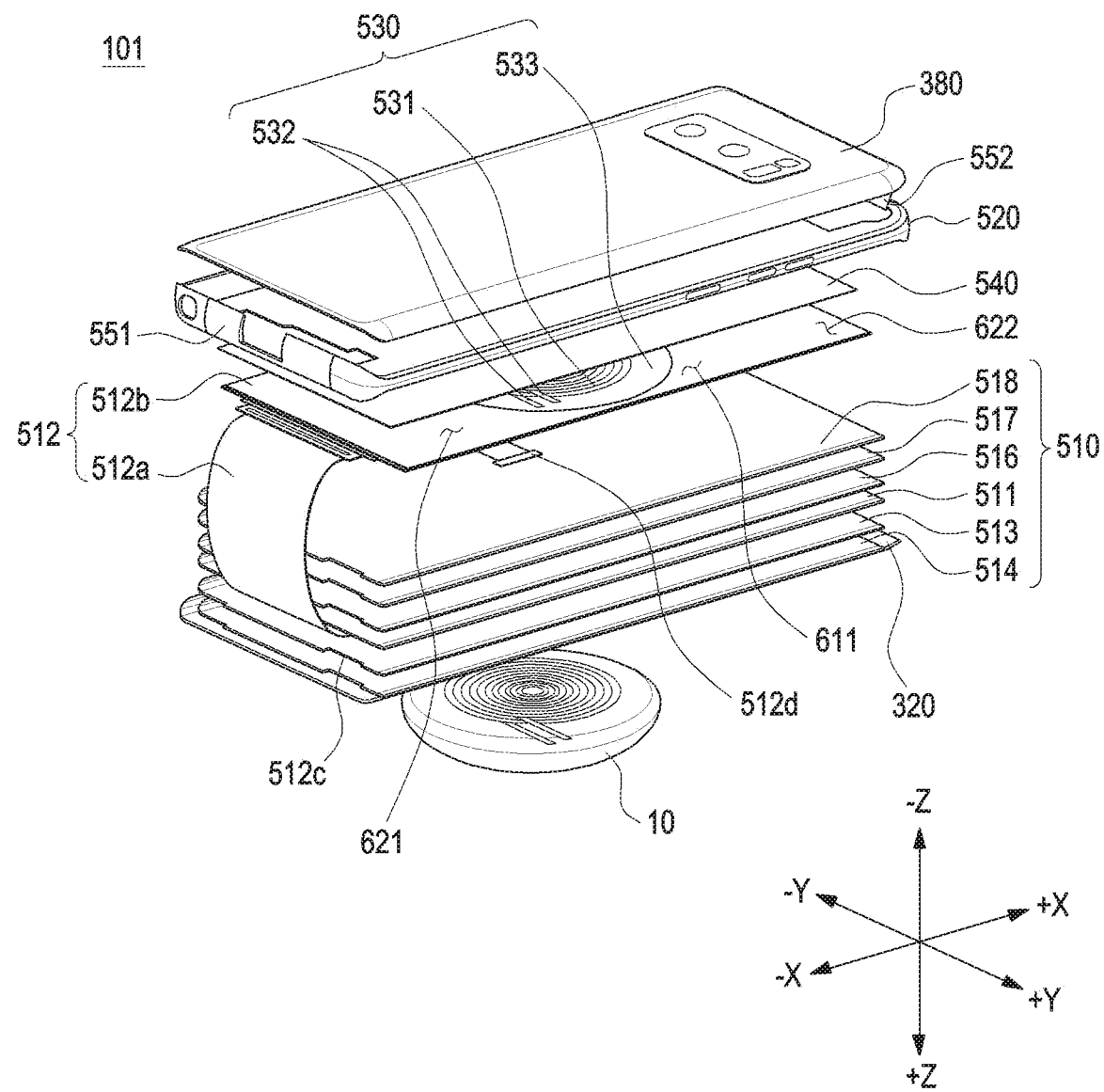
FIG. 7 is a perspective view schematically illustrating a stack structure of an electronic device according to an embodiment of the disclosure.

FIG. 7 is a perspective view schematically illustrating a stack structure of an electronic device according to an embodiment of the disclosure.

Referring to FIG. 7, an electronic device 101 (e.g., the electronic device 101 of FIGS. 1 to 4) may include a front plate 320, a rear plate 380, a display assembly 510, a bracket 520, a wireless charging structure 530, and a magnetic plate 540. As another example, the electronic device 101 may include the first antenna 551 or the second antenna 552 formed in at least one area of the bracket 520.

The structure of the front plate 320, the rear plate 380, the display assembly 510, the bracket 520, and the wireless charging structure 530 in FIG. 7 may be partially or wholly the same as the structure of the front plate 320, the rear plate 380, the display assembly 510, the bracket 520, and the wireless charging structure 530 in FIGS. 6A and 6B.

The display assembly 510 may include a display panel 511 and a flexible printed circuit board 512 extending from the display panel 511 and at least partially bent. As another example, the display assembly 510 may include an optical layer 513 and a dielectric layer 514 disposed on the front face of the display panel 511. As another example, the display assembly 510 may include a plurality of layers (e.g., an embossing layer and a cushion) on the rear face of the display panel 511. Hereinafter, a description will be made with reference to a difference from FIG. 6A.

According to various embodiments of the disclosure, the flexible printed circuit board 512 of the display assembly 510 may be electrically connected to the display panel 511, and may include a first area 512a electrically connected to the display panel 511 and at least partially bent, and a second area 512b extending from the first area 512a and disposed between the bracket 520 and the display panel 511. For example, the first area 512a of the flexible printed circuit board 512 may extend from an end of the display panel 511, and may be bent towards the rear plate 380 (e.g., in the second direction (−Z)) so as to be connected to the second area 512b.

According to various embodiments of the disclosure, the second area 512b of the flexible printed circuit board 512 may be provided substantially in a plate shape, and the length of the second area 512b may correspond to the size of the display panel 511 of the electronic device 101. For example, the second area 512b may include a first shielding area 621 disposed to face the first antenna 551 and a second shielding area 622 disposed to face the second antenna 552. The first shielding area 621 and the second shielding area 622 may include copper (Cu) for preventing the inflow of electromagnetic waves generated from the first antenna 551 and the second antenna 552. As another example, when the second area 512b is provided in a size similar to that of the display panel 511, a heat dissipation sheet (e.g., a graphite sheet) for thermal diffusion may be disposed on at least one face of the second area 512b.

According to an embodiment of the disclosure, a coil area 611 in which the wireless charging structure 530 is disposed may be included between the first shielding area 621 and the second shielding area 622 of the second area 512b. For example, the coil portion 531 of the wireless charging structure 530 disposed in the coil area 611 may be stacked on each of the conductive layers of the coil area 611, and may be electrically connected to each other through vias.

According to various embodiments of the disclosure, the magnetic plate 540 of the electronic device 101 may be disposed between the bracket 520 and the flexible printed circuit board 512. For example, the magnetic plate 540 may be formed to be stacked in the area in which the wireless charging structure 530 may be disposed so as to improve charging efficiency of the wireless charging structure 530 and to lower surface heat generation.

According to an embodiment of the disclosure, the magnetic plate 540 is provided as a sheet paper of about 0.2 mm or less, and may be manufactured in a size capable of covering the wireless charging structure 530. The magnetic plate 540 may be formed to have a size corresponding to that of the flexible printed circuit board 512. For example, when the electronic device 101 includes a display assembly 510 including a digitizer, a magnetic plate 540 having a size corresponding to that of the digitizer may be implemented in order to improve the performance of the digitizer and to limit the interference of electromagnetic waves from external components.

Figure 8:
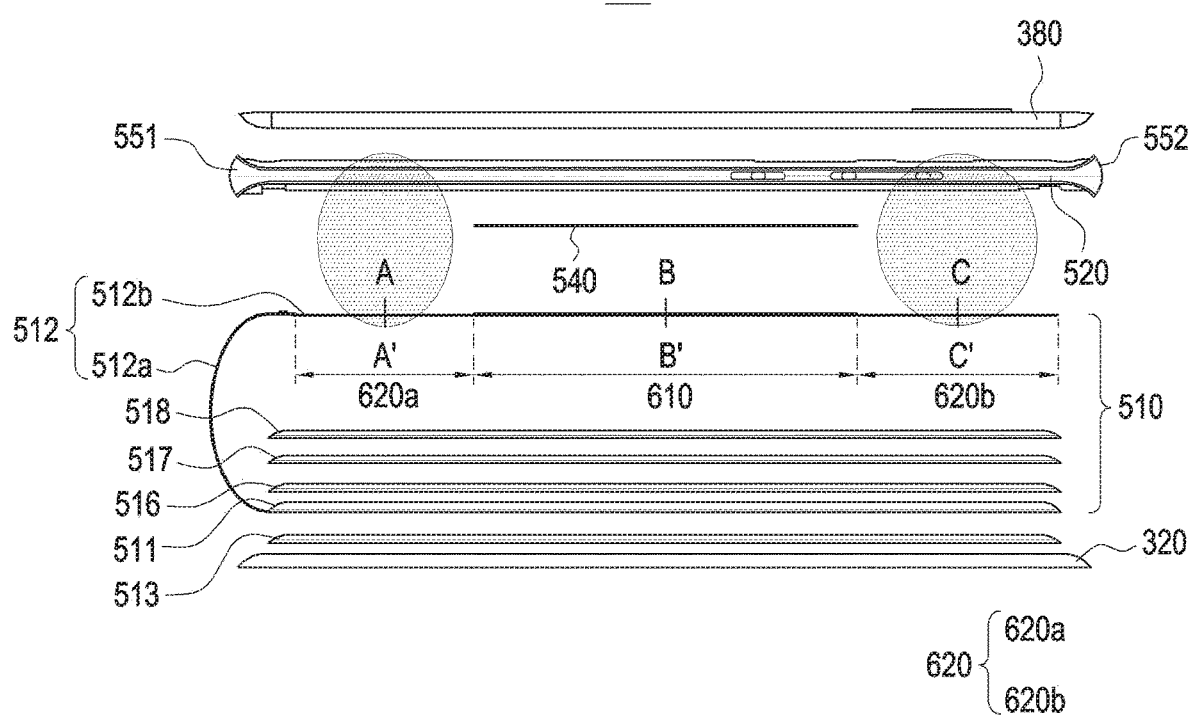
FIG. 8 is a cross-sectional view schematically illustrating a stack structure of a flexible printed circuit board and peripheral components of an electronic device according to an embodiment of the disclosure.

FIG. 8 is a cross-sectional view schematically illustrating a stack structure of a flexible printed circuit board and peripheral components of an electronic device according to an embodiment of the disclosure.

Referring to FIG. 8, an electronic device 101 (e.g., the electronic device 101 of FIGS. 1 to 4) may include a front plate 320, a rear plate 380, a display assembly 510, a bracket 520, a wireless charging structure 530, and a magnetic plate 540. As another example, the electronic device 101 may include the first antenna 551 or the second antenna 552 formed in at least one area of the bracket 520.

The structure of the front plate 320, the rear plate 380, the display assembly 510, the bracket 520, the wireless charging structure 530, and the magnetic plate 540 in FIG. 8 may be partially or wholly the same as the structure of the front plate 320, the rear plate 380, the display assembly 510, the bracket 520, the wireless charging structure 530, and the magnetic plate 540 in FIG. 6A.

According to various embodiments of the disclosure, the flexible printed circuit board 512 of the display assembly 510 may be electrically connected to the display panel 511, and may include a first area 512a electrically connected to the display panel 511 and at least partially bent, and a second area 512b extending from the first area 512a and disposed between the bracket 520 and the display panel 511.

According to various embodiments of the disclosure, the second area 512b may include a coil area 610 in which the wireless charging structure 530 is disposed and a shielding area 620 extending from the coil area 610. The shielding area 620 may be disposed adjacent to the first antenna 551 or the second antenna 552 of the electronic device 101, and may suppress the influence of electromagnetic waves generated by the first antenna 551 or the second antenna 552 on other components of the electronic device 101.

According to various embodiments of the disclosure, at least a portion of the shielding area 620 may be provided as a ground of the electronic device 101. For example, the shielding area 620 may be spaced apart from the metal area of the bracket 520 by a predetermined interval, and may implement an AC connection structure by forming a capacitance using a specified area in which the shielding area 620 and the metal area face each other. As another example, at least a portion of the shielding area 620 may implement a DC connection structure through contact connection between the metal area of the bracket 520 and a conductive member (e.g., a conductive film).

FIG. 16 illustrates materials disposed on respective end faces when a second area of a flexible printed circuit board is divided into a coil area, a first shielding area connected to one end of a coil area, and a second shielding area connected to other end of the coil area according to an embodiment of the disclosure.

Referring to FIG. 16, it represents materials disposed on respective end faces when the second area 512b of the flexible printed circuit board 512 is divided into a coil area 610, a first shielding area 620a connected to one end of the coil area 610, and a second shielding area 620b connected to the other end of the coil area 610. In FIG. 16, the shaded or hatched areas mean that materials are stacked.

According to various embodiments of the disclosure, FIG. 16 may provide a cross section of the first shielding area 620a of the flexible printed circuit board 512, taken along line A-A'. Referring to the cross section, the first shielding area 620a may include a plurality of circuit layers.

According to an embodiment of the disclosure, at least one circuit layer may be formed by processing, by methods, such as exposure and etching, a thin copper plate disposed on the entire upper face and/or the entire lower face of a polyimide (PI)-based substrate layer, such as a flexible copper clad laminate (FCCL). As another example, the at least one circuit layer may include a thin copper plate stacked on each of the upper and lower faces of a polyimide (PI)-based substrate layer and a copper foil circuit layer plated on the copper. As another example, the upper face of the plated copper foil circuit layer may be coated with an ink layer so as to protect the circuit.

According to an embodiment of the disclosure, a dielectric layer, such as a prepreg, may be disposed between each adjacent circuit layer among a plurality of circuit layers, and thus it is possible to implement multi-circuit layers in which the above-described circuit layer configuration is repeatedly applied. For example, as represented in FIG. 16, six circuit layers may be provided.

According to an embodiment of the disclosure, a plurality of components (e.g., SMD components) may be mounted on one face of the multi-circuit layers, and the copper foil circuit layer may be formed on the uppermost face of the multi-circuit layers in order to facilitate the mounting of the plurality of components.

According to an embodiment of the disclosure, the thin copper plate constituting each of the circuit layers may provide a function of a shielding layer for blocking electromagnetic interference (EMI). For example, the copper thin plates formed on the respective circuit layers may block the interference of electromagnetic waves such that the electromagnetic waves generated by the first antenna 551 do not affect the peripheral electronic components of the electronic device 101.

According to various embodiments of the disclosure, FIG. 16 may provide a cross section of the coil area 610 of the flexible printed circuit board 512, taken along line B-B'. Referring to the cross section, a plurality of circuit layers, a magnetic plate, and a heat dissipation sheet may be included, and a wireless charging structure may be disposed in at least some areas of the plurality of circuit layers.

According to an embodiment of the disclosure, at least one circuit layer may be formed by processing, by methods, such as exposure and etching, a thin copper plate disposed on the entire upper face and/or the entire lower face of a polyimide (PI)-based substrate layer, such as a flexible copper clad laminate (FCCL). As another example (not illustrated), the at least one circuit layer may include a thin copper plate stacked on each of the upper and lower faces of a polyimide (PI)-based substrate layer and a copper foil circuit layer plated on the copper. As another example, the upper face of the plated copper foil circuit layer may be coated with an ink layer so as to protect the circuit.

According to an embodiment of the disclosure, a dielectric layer, such as a prepreg, may be disposed between each adjacent circuit layer among a plurality of circuit layers, and thus it is possible to implement multi-circuit layers in which the above-described circuit layer configuration is repeatedly applied. For example, as represented in FIG. 16, six circuit layers may be provided.

According to an embodiment of the disclosure, a wireless charging structure including a coil may be disposed on at least some of the multi-circuit layers. For example, each of the six circuit layers may include a coil area in which a coil for wireless charging are included. and each of the coils may be connected a via penetrating the circuit layers.

According to an embodiment of the disclosure, a magnetic plate and a heat dissipation sheet may be disposed on the upper face of the multi-circuit layers. The magnetic plate may be made of a material including a magnetic substance in order to improve the efficiency of the wireless charging circuit, and the heat dissipation sheet may efficiently dissipate heat generated by the flexible printed circuit board.

According to various embodiments of the disclosure, FIG. 16 may provide a cross section of a second shielding area 620*b* of the flexible printed circuit board 512, taken along line C-C'. Referring to the cross section, a plurality of circuit layers may be included.

According to an embodiment of the disclosure, at least one circuit layer may be formed by processing, by methods, such as exposure and etching, a thin copper plate disposed on the entire upper face and/or the entire lower face of a polyimide (PI)-based substrate layer, such as a flexible copper clad laminate (FCCL). As another example (not illustrated), the at least one circuit layer may include a thin copper plate stacked on each of the upper and lower faces of a polyimide (PI)-based substrate layer and a copper foil circuit layer plated on the copper. As another example, the plated copper foil circuit layer may be coated with an ink layer so as to protect the circuit.

According to an embodiment of the disclosure, a dielectric layer, such as a prepreg, may be disposed between each adjacent circuit layers among a plurality of circuit layers, and thus it is possible to implement multi-circuit layers in which the above-described circuit layer configuration is repeatedly applied. For example, as represented in FIG. 16, six circuit layers may be provided.

According to an embodiment of the disclosure, the thin copper plate constituting each of the circuit layers may provide a function of a shielding layer for blocking electromagnetic interference (EMI). For example, the copper thin plates formed on the respective circuit layers may block the interference of electromagnetic waves such that the electromagnetic waves generated by the second antenna 552 do not affect the peripheral electronic components of the electronic device 101.

According to an embodiment of the disclosure, a heat dissipation sheet may be disposed on the upper face of the multi-circuit layers. The heat generated by the flexible printed circuit board may be efficiently diffused by the heat dissipation sheet.

Figure 9:
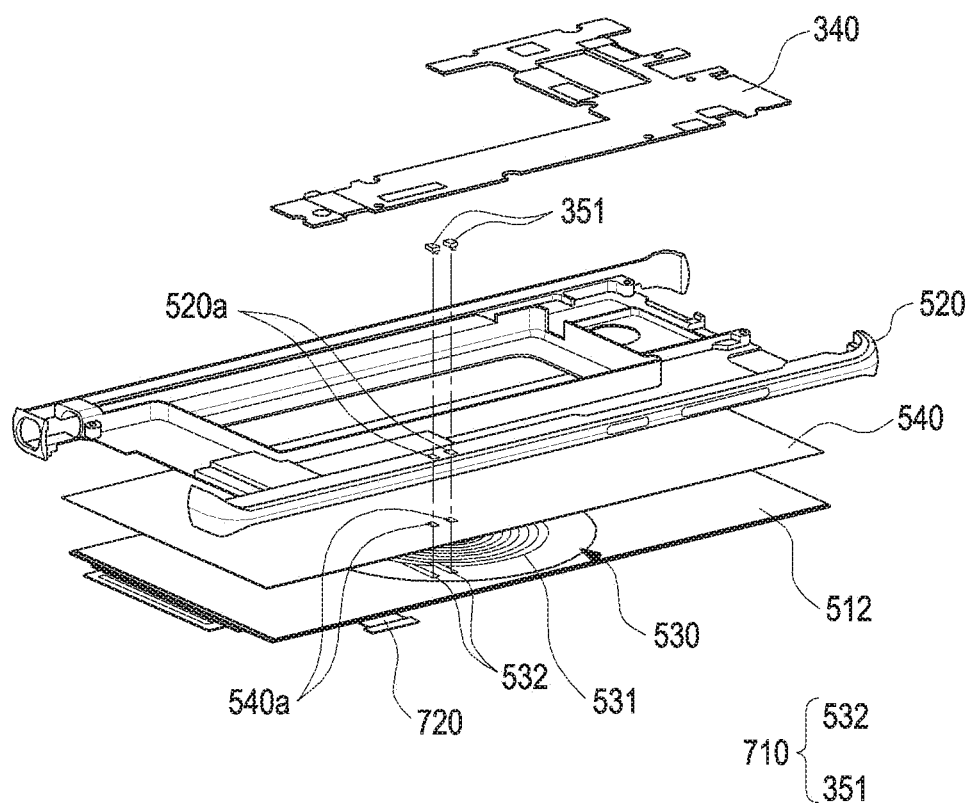
FIG. 9 is a perspective view illustrating an electrical connection relationship of a flexible printed circuit board according to an embodiment of the disclosure.

FIG. 9 is a perspective view illustrating an electrical connection relationship of a flexible printed circuit board according to an embodiment of the disclosure.

Referring to FIG. 9, an electronic device 101 (e.g., the electronic device 101 in FIGS. 1 to 4) may include a flexible printed circuit board 512 of a display assembly (e.g., the display assembly 510 in FIG. 6A), a bracket 520, a wireless charging structure 530, and a magnetic plate 540.

The structure of the flexible printed circuit board 512 of the display assembly 510, the bracket 520, the wireless charging structure 530, and the magnetic plate 540 in FIG. 9 may be partially or wholly the same as the structure of the flexible printed circuit board 512 of the display assembly, the bracket 520, the wireless charging structure 530, and the magnetic plate 540 in FIG. 6A.

According to various embodiments of the disclosure, a first connection structure 710 and a second connection structure 720 may be disposed inside the flexible printed circuit board 512. The first connection structure 710 and the second connection structure 720 may have different signal connection structures.

According to an embodiment of the disclosure, the first connection structure 710 may electrically connect the wireless charging structure 530 to the main printed circuit board 340. For example, the first connection structure 710 may include transmission wires 532 extending from the coil portion 531 of the wireless charging structure 530 and a contact 351 disposed on the main printed circuit board 340. According to an embodiment of the disclosure, the contact 351 has a protruding structure shape disposed to face the area in which the transmission wires 532 are disposed, and may be in contact with the ends of the transmission wires 532 through the first opening 520a in the bracket 520 and/or the second opening 540a in the magnetic plate 540. The second opening 540a may be configured in various forms not covering at least one area of the coil portion 531. At least a portion of the first opening 520a and at least a portion of the second opening 540a may be disposed on the same line (e.g., overlap) such that, after passing through the first opening 520a, the contact 351 passes through the second opening 540a. The contact 351 may be a C-clip or a short pad, and may form a connection structure of the shortest path between the main printed circuit board 340 and the wireless charging structure 530. Accordingly, the DC resistance component may be minimized so as to improve charging efficiency and to limit heat generation caused during wireless charging.

According to an embodiment of the disclosure, the second connection structure 720 may extend from one side of the flexible printed circuit board 512, and may be electrically connected to the main printed circuit board 340. For example, the second connection structure 720 may include a coaxial cable connector or a board-to-board (BTB) connector for signal connection of a display, a touch sensor, a fingerprint sensor, a pressure sensor, an optical sensor, or an EMR sensor. The second connection structure 720 may connect the main printed circuit board 340 and the flexible printed circuit board 512 by bypassing or passing through the bracket 520, and may have a partially bent shape.

Figure 10:
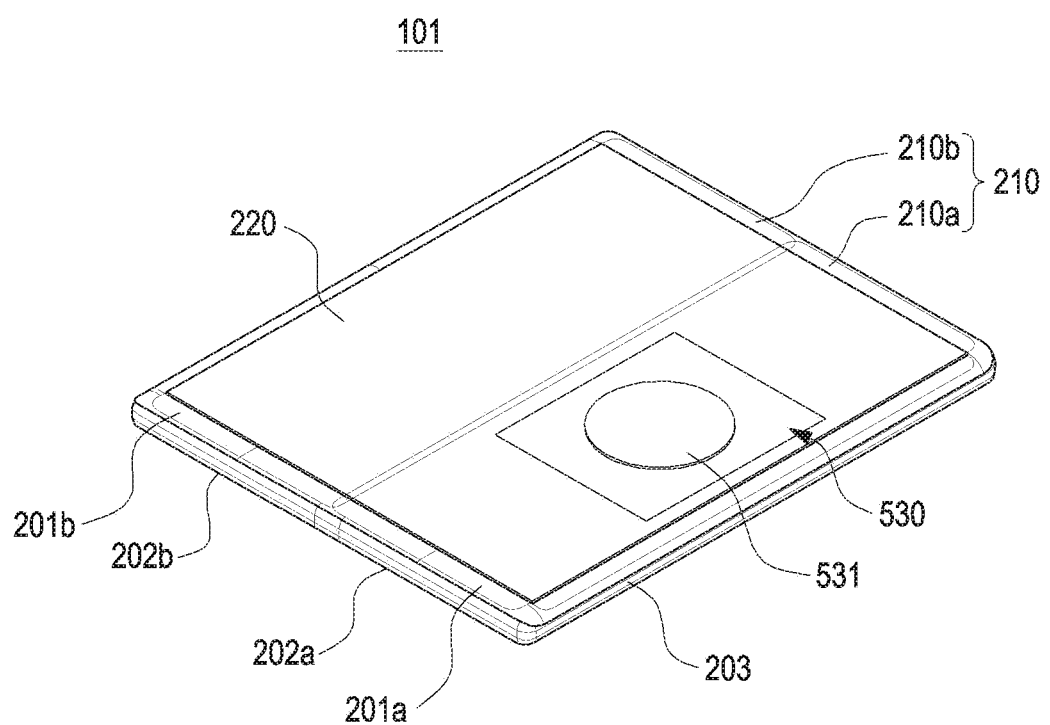
FIG. 10 is a front view illustrating an electronic device in an unfolded state according to an embodiment of the disclosure.
Figure 11:
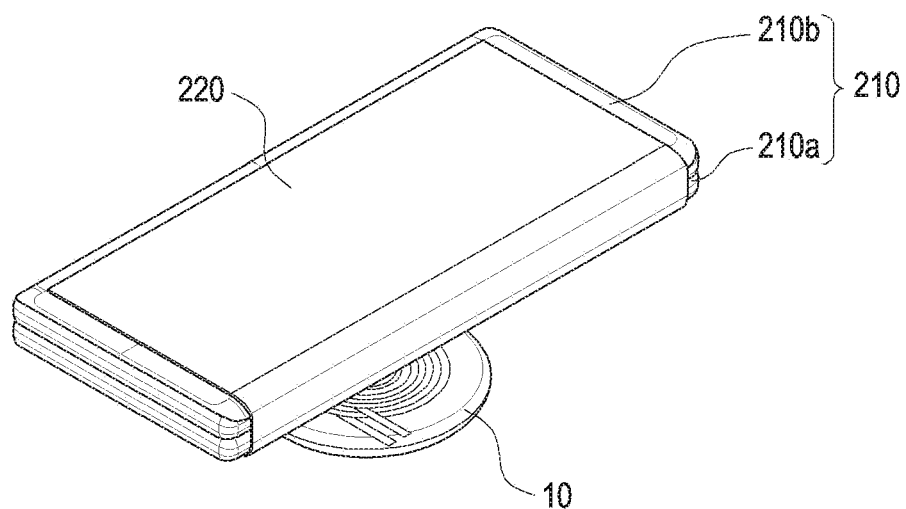
FIG. 11 is a front view illustrating an electronic device in a folded state according to an embodiment of the disclosure.
Figure 12:
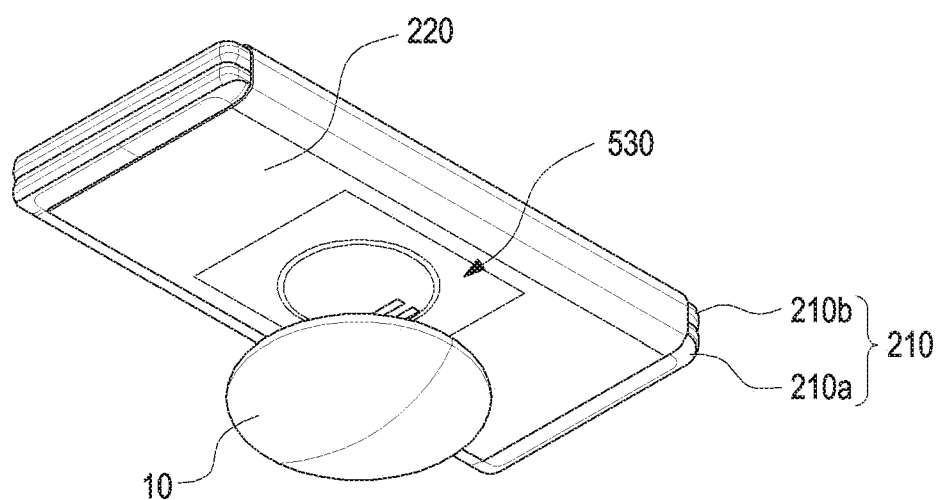
FIG. 12 is a rear view illustrating an electronic device in a folded state according to an embodiment of the disclosure.

FIG. 10 is a front view illustrating an electronic device in an unfolded state according to an embodiment of the disclosure. FIG. 11 is a front view illustrating an electronic device in a folded state according to an embodiment of the disclosure. FIG. 12 is a rear view illustrating an electronic device in a folded state according to an embodiment of the disclosure.

Referring to FIGS. 10 to 12, the structure of the electronic device 101 may be partially or wholly the same as the structure of the electronic device 101 of FIG. 1. The descriptions of the components of the wireless charging structure 530 of the electronic device 101 may be applicable to the components of the wireless charging device 530 of FIGS. 6A to 9.

As illustrated in FIGS. 10 to 12, the electronic device 101 may include a plurality of foldable housings 210, a display 220, a wireless charging structure 530, and a connection structure (e.g., a hinge structure). The foldable housings 210 may include a first housing 210a and a second housing 210b. The first housing 210a may include a first face 201a corresponding to a front face, a second face 202a corresponding to a rear face of the foldable housing 210, and a side face 203 that surrounds at least a portion of the space between the first face 201a and the second face 202a. The second housing 210b may include a third face 201b corresponding to the front face, a fourth face 202b corresponding to the rear face, and a side face surrounding at least a portion of the space between the third face 201b and the fourth face 202b.

According to various embodiments of the disclosure, at least a portion of the first face 201a of the first housing 210a may be opened, and a transparent cover may be mounted to form at least a portion of the first face 201a of the first housing 210a so as to close the opened first face 201a of the first housing 210a. As another example, at least a portion of the third face 201b of the second housing 210a may be opened, and a transparent cover may be mounted to form at least a portion of the third face 201b of the second housing 210a so as to close the opened third face 201a of the second housing 210b.

According to various embodiments of the disclosure, various circuit devices, such as a processor 120, memory 130, the interface 177, and so on, which have been described with reference to FIG. 1) may be accommodated within the housings 210, and it is possible to secure power by accommodating a battery in the housings 210.

According to various embodiments of the disclosure, the electronic device 101 may include a first housing 210a, a second housing 210b, and a hinge structure, and the hinge structure may rotatably connect the second housing 210b and the first housing 210a to each other. For example, the electronic device 101 may exhibit a folded state in which the second housing 210b is rotatable with respect to the first housing 210a. Depending on the rotation operation, a folded state in which the first housing 210a and the second housing 210b face each other, an unfolded state in which the first housing structure 310 and the second housing structure 320 are disposed side by side, or an intermediate status maintaining a predetermined angle between the first housing 210a and the second housing 210b may be provided.

According to various embodiments of the disclosure, a display 220 may be disposed on the front faces of the first housing 210a, the second housing 210b, and the hinge structure 230. The display 220 may be disposed to extend from the first housing 210a to the second housing 210b across the hinge structure, and may be provided in a flexible structure so as to be folded about a virtual hinge axis formed in the longitudinal direction of the hinge structure.

According to various embodiments of the disclosure, the first housing 210a is rotatable by 0 to 180 degrees with respect to the second housing 210b. As the first housing 210a is rotated 180 degrees with respect to the second housing 210b and the electronic device 101 is in the folded state, the second face 202a of the first housing 210a and the fourth face 202b of the second housing 210b may be disposed to face each other.

According to various embodiments of the disclosure, the wireless charging structure 530 of the electronic device 101 is disposed inside the first housing 210a or the second housing 210b, and may be mounted on the rear face of the display 220. For example, the wireless charging structure 530 may be disposed inside the first housing 210a, and in the state in which the electronic device 101 is folded, a wireless charging function may be performed through an area of the display 220. As another example, the wireless charging structure 530 may be disposed inside each of the first housing 210a and the second housing 210b, and in the state in which the electronic device 101 is folded so as to perform a wireless charging function (e.g., wireless power transmission and wireless power reception functions) through the display 220.

According to various embodiments of the disclosure, the display 220 may externally indicate whether the wireless charging structure 530 and a wireless charging device 10 are aligned with each other. For example, when the wireless charging structure 530 and the wireless charging device 10 are located within a predetermined distance, the display 220 may indicate, through an image or a picture, that a wireless charging mode is performed. Thereafter, the display 220 may display alignment information through an external display interface having the same color or shape as the wireless charging device such that the wireless charging structure 530 and the wireless charging device 10 are correctly aligned. When the wireless charging structure 530 and the wireless charging device 10 are correctly aligned, the display 220 may externally indicate that charging is initiated. As another example, when the wireless charging structure 530 and the wireless charging device 10 are not properly aligned, a movement indication may be externally displayed such that the wireless charging structure 530 moves in a designated direction for correct alignment with the wireless charging device 10.

According to various embodiments of the disclosure, the display 220 may provide charging state information between the wireless charging structure 530 and the wireless charging device 10. For example, state information related to the progress of wireless charging (e.g., battery amount/charging progress rate/charging wait time) may be provided along with information as to whether or not the wireless charging structure 530 and the wireless charging device 10 are aligned. When the wireless charging structure 530 and the wireless charging device 10 initiate charging, the display 220 may display the charging state information using an image or a picture including various colors. As another example, the display 220 may indicate information as to the charging state and whether the charging is completed through an alarm and/or an external display interface. The charging state information may be displayed in the wireless charging device 10 or in an area of the display 220 adjacent to the wireless charging device 10.

Figure 13:
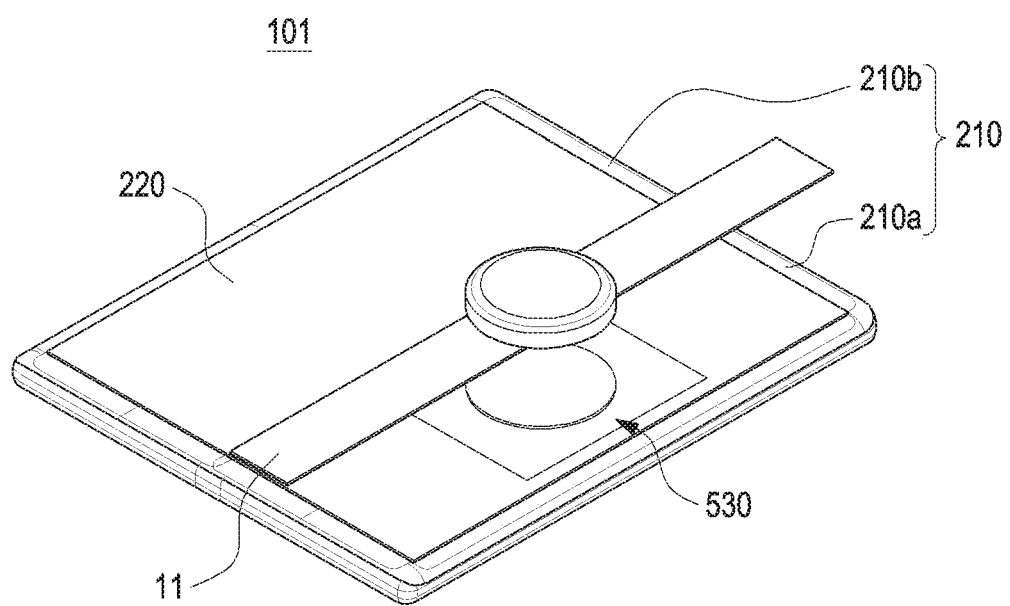
FIG. 13 is a perspective view illustrating an electronic device in an unfolded state and an external charging receiving device according to an embodiment of the disclosure.

FIG. 13 is a perspective view illustrating an electronic device in an unfolded state and an external charging receiving device according to an embodiment of the disclosure.

Figure 14:
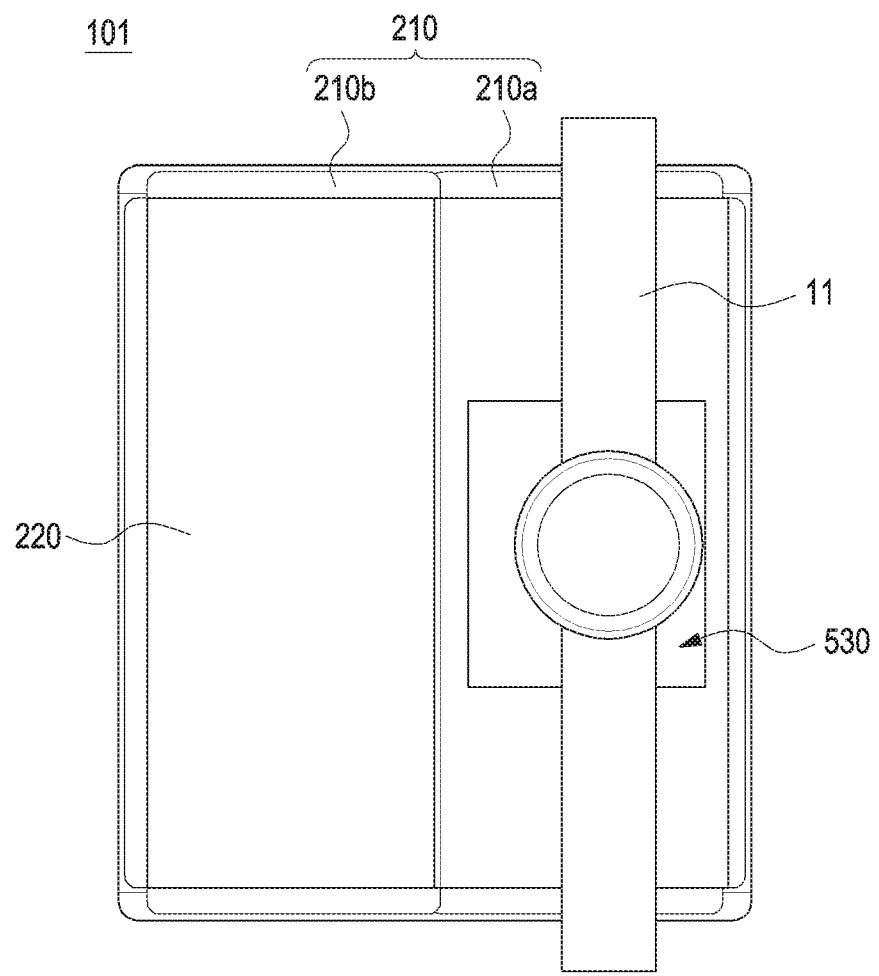
FIG. 14 is a front view illustrating an electronic device in an unfolded state and an external charging receiving device according to an embodiment of the disclosure.
Figure 15:
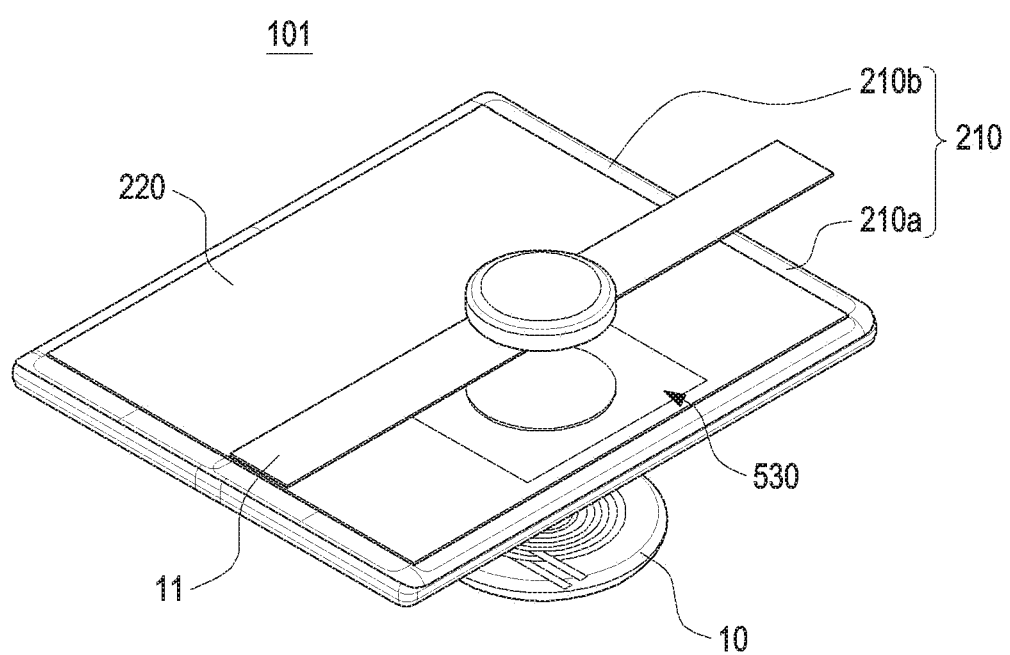
FIG. 15 is a perspective view illustrating an electronic device in an unfolded state and external charging transmission and reception devices according to an embodiment of the disclosure.

FIG. 14 is a front view illustrating an electronic device in an unfolded state and an external charging receiving device according to an embodiment of the disclosure. FIG. 15 is a perspective view illustrating an electronic device in an unfolded state and external charging transmission and reception devices according to an embodiment of the disclosure.

Referring to FIGS. 13 to 15, the structure of the electronic device 101 may be partially or wholly the same as the structure of the electronic device 101 of FIGS. 10, 11 and 12. For example, the electronic device 101 may have an out-folding structure in which the flexible display 220 is exposed to the outside in folding status (ex, one of the unfolded state, the intermediate state, and the folded state. As another example, the electronic device 101 may have an in-folding structure in which the flexible display 220 is not exposed to the outside in the unfolded state of the folding status.

The descriptions of the components of the wireless charging structure 530 of the electronic device 101 may be applicable to the components of the wireless charging device 530 of FIGS. 6A to 9.

Referring to FIGS. 13 to 15, the electronic device 101 may include a plurality of foldable housings 210, a display 220, at least one wireless charging structure 530, and a connection structure (e.g., a hinge structure). The foldable housing 210 may include a first housing 210a and a second housing 210b, and wireless charging structure 530 may be disposed in the first housing 210a or the second housing 210b and may be mounted on the rear face of the display 220. For example, the wireless charging structure 530 may be disposed inside the first housing 210a, and in the state in which the electronic device 101 is unfolded, a wireless charging function may be performed through an area of the display 220. As another example, the wireless charging structure 530 may include a first wireless charging structure and a second wireless charging structure. The first wireless charging structure and the second wireless charging structure may perform the wireless charging function in the state in which the electronic device 101 is unfolded or folded. The first wireless charging structure may transmit wireless power to an external charging receiving device 11 through an area of the display 220. The second wireless charging structure may receive energy from the wireless charging device 10 through an area of the rear plate of the foldable housings 210.

According to various embodiments of the disclosure, the display 220 may externally indicate whether the wireless charging device 10 or the external wireless charging receiving device 11 is aligned with the at least one wireless charging structure 530 such that the wireless charging structure 530 is able to perform efficient wireless charging. The wireless charging receiving device 11 may include various wearable electronic devices, such as a watch.

An electronic device (e.g., the electronic device 101 in FIGS. 1 to 4) according to various embodiments may include: a housing (e.g., 310 in FIG. 2) including a front plate (e.g., 320 in FIG. 6A) that faces a first direction and a rear plate (e.g., 380 in FIG. 6A) that faces a second direction, which is opposite the first direction, a display panel (e.g., 511 in FIG. 6A) configured to output a screen through the front plate, a bracket (e.g., 520 in FIG. 6A) disposed between the display panel and the rear plate, the bracket being configured to support internal components, a flexible printed circuit board (e.g., 512 in FIG. 6A) including a first area (e.g., 512a in FIG. 6A) electrically connected to the display panel, and a second area (e.g., 512b in FIG. 6A) extending from the first area and disposed between the display panel and the bracket, a wireless charging structure (e.g., the wireless charging structure 530 in FIG. 6A) disposed on one face of the second area or inside the second area, the wireless charging structure 530 including a coil portion (e.g., 531 in FIG. 6A) and transmission wires (e.g., 532 in FIG. 6A) electrically connected to the coil portion 531, and a magnetic plate (e.g., 540 in FIG. 6A) disposed between the bracket and the flexible printed circuit board, and at least one area of the magnetic plate being disposed to face the wireless charging structure.

According to various embodiments of the disclosure, the first area may extend from one end of the display panel and is bent towards the rear plate, and the second area may have an area corresponding to at least a portion of the display panel and may be spaced apart from the at least a portion of the display panel.

According to various embodiments of the disclosure, the second area of the flexible printed circuit board may include a coil area (e.g., 610 in FIG. 6A) in which the wireless charging structure is disposed, and a shielding area (e.g., 620 in FIG. 6A) extending from the coil area towards a front end portion or a rear end portion of the electronic device.

According to various embodiments of the disclosure, the electronic device may further include: a main printed circuit board (e.g., 340 in FIG. 9) disposed between the bracket and the rear plate, a first connection structure (e.g., 710 in FIG. 9) at least partially disposed in the second area and electrically connecting the wireless charging structure to the main printed circuit board, and a second connection structure (e.g., 720 in FIG. 9) extending from one side of the second area and electrically connecting the flexible printed circuit board to the main printed circuit board.

According to various embodiments of the disclosure, the first connection structure may include a contact (e.g., 351 in FIG. 9) disposed to be in contact with one end portion of the transmission wires and an area of the main printed circuit board, the contact being formed to pass through a first opening (e.g., 520a in FIG. 9) in the bracket disposed between the flexible printed circuit board and the main printed circuit board.

According to various embodiments of the disclosure, the magnetic plate may include a second opening (e.g., 540a in FIG. 9), and at least a portion of the first opening and at least a portion of the second opening are arranged on the same line so as to allow the contact (e.g., 351 in FIG. 9) to pass therethrough.

According to various embodiments of the disclosure, the electronic device may further include a heat dissipation sheet disposed between the magnetic plate and the bracket. At least a portion of the heat dissipation sheet may have a size corresponding to that of the magnetic plate.

According to various embodiments of the disclosure, the wireless charging structure may further include a coil portion (e.g., 531 in FIG. 6A) including at least one layer wound in a predetermined first shape designated by a first turn number, a core portion (e.g., 533 in FIG. 6A) at least partially disposed inside the second area, the at least one layer and the transmission wires being embedded in the core portion, and a control circuit set to wirelessly transmit power using the coil portion 531.

According to various embodiments of the disclosure, the electronic device may further include a first antenna (e.g., the first antenna 551 in FIG. 6A) disposed at a rear end portion of the bracket, and a second antenna (e.g., the second antenna 552 in FIG. 6A) disposed at a front end portion of the bracket. The second area of the flexible printed circuit board may include: a coil area in which the wireless charging structure is disposed, and a shielding area extending from the coil area towards a rear end portion of the electronic device, the shielding area being configured to block electromagnetic waves generated from the first antenna.

According to various embodiments of the disclosure, the electronic device may further include a shielding member (e.g., 630 in FIG. 6A) disposed on the same plane as the flexible printed circuit board, the shielding member being disposed parallel to the shielding area with the coil area interposed therebetween. The shielding member may block electromagnetic waves generated from the second antenna.

According to various embodiments of the disclosure, the electronic device may further include a first antenna (e.g., the first antenna 551 in FIG. 7) disposed at a lower end portion of the bracket, and a second antenna (e.g., the second antenna 552 in FIG. 7) disposed at an upper end portion of the bracket. The second area of the flexible printed circuit board may include a coil area (e.g., 611 in FIG. 7) in which the wireless charging structure is disposed, a first shielding area (e.g., 621 in FIG. 7) extending from one end portion of the coil area towards a rear end portion of the electronic device, the first shielding area being configured to block electromagnetic waves generated from the first antenna, and a second shielding area (e.g., 622 in FIG. 7) extending from another end portion of the coil area towards a front end portion of the electronic device, the second shielding area being configured to block electromagnetic waves generated from the second antenna.

According to various embodiments of the disclosure, the magnetic plate may extend from the first shielding area to the second shielding area across the coil area.

According to various embodiments of the disclosure, the electronic device may further include a heat dissipation sheet disposed between the magnetic plate and the bracket. The magnetic plate may be disposed to face the coil portion of the wireless charging structure, and the heat dissipation sheet may extend to the coil area and the second shielding area.

According to various embodiments of the disclosure, the electronic device may further include a display assembly including the display panel. The housing may include a hinge structure, a first housing connected to the hinge structure, and a second housing folded with the first housing about the hinge structure, and the wireless charging structure may be disposed inside the first housing or the second housing so as to perform wireless charging through the display assembly.

According to various embodiments of the disclosure, an electronic device (e.g., the electronic device 101 in FIGS. 1 to 4) may include: a housing including a front plate that faces a first direction and a rear plate that faces a second direction, which is opposite the first direction, a display assembly configured to output a screen through the front plate, the display assembly including a display panel and a flexible printed circuit board stacked with the display panel, a bracket disposed between the flexible printed circuit board and the rear plate, the bracket being configured to support internal components, a main printed circuit board disposed between the bracket and the rear plate, and electrically connected to the flexible printed circuit board, a first wireless charging structure disposed on one face of the flexible printed circuit board or inside the flexible printed circuit board, the wireless charging structure including a coil portion and transmission wires electrically connected to the coil portion, and a magnetic plate disposed between the bracket and the flexible printed circuit board, and at least one area of the magnetic plate being disposed to face the first wireless charging structure.

According to various embodiments of the disclosure, the flexible printed circuit board may include a coil area in which the first wireless charging structure is disposed, and a shielding area extending from the coil area towards a front end portion or a rear end portion of the electronic device.

According to various embodiments of the disclosure, the electronic device may further include a second wireless charging structure disposed between the bracket and the rear plate.

According to various embodiments of the disclosure, the first wireless charging structure may guide a generated magnetic flux to penetrate at the display assembly and at least a portion of the front plate in order to transmit/receive wireless power to/from an external wireless charging device or an external wireless transmitting device.

An electronic device according to various embodiments of the disclosure may further include: a foldable housing including a hinge structure, a first housing connected to the hinge structure, and including a first face that faces a first direction, and a second face that faces a second direction opposite the first direction, a second housing connected to the hinge structure and including a third face that faces a third direction, and a fourth face that faces a fourth direction opposite the third direction, the second housing structure being configured to be folded with the first housing about the hinge structure. In a folded state, the second face may face the fourth face, and, in an unfolded state, the third direction may be the same as the first direction. The electronic device may include: a display panel extending from the first housing to the second housing across the hinge structure, the display panel being configured to output a screen through the first face or the third face, a bracket disposed between the first face and the second face within the first housing, the bracket being configured to support internal components, a flexible printed circuit board including a first area electrically connected to the display panel, and a second area extending from the first area and disposed between the display panel and the bracket, a wireless charging structure disposed on one face of the second area or inside the second area, the wireless charging structure including a coil portion and transmission wires electrically connected to the coil portion, and a magnetic plate disposed between the bracket and the flexible printed circuit board, and at least one area of the magnetic plate being disposed to face the wireless charging structure.

According to various embodiments of the disclosure, the second area of the flexible printed circuit board may include a coil area in which the wireless charging structure is disposed, and a shielding area extending from the coil area towards a front end portion or a rear end portion of the electronic device.

According to various embodiments of the disclosure, the coil portion may include at least one coil where an opening is provided in an inner center, power transmission wires extending from an inner diameter end portion or an outer diameter end portion, and electrically connected to the flexible printed circuit board.

According to various embodiments of the disclosure, the coil portion may include at least one coil where a plurality of layers are stacked on respective conductive layers of the flexible printed circuit board.

According to various embodiments of the disclosure, the coil portion may include a plurality of coils implemented in different turn numbers and different shapes.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
    a housing including a front plate and a rear plate forming an exterior of the electronic device;
    a display panel configured to output an image visible through the front plate;
    a bracket disposed between the display panel and the rear plate, the bracket being configured to support internal components of the electronic device;
    a flexible printed circuit board including a first area electrically connected to the display panel, and a second area extending from the first area and disposed between the display panel and the bracket;
    a wireless charging structure disposed on one face of the second area or inside the second area, the wireless charging structure including a coil portion and transmission wires electrically connected to the coil portion; and
    a magnetic plate disposed between the bracket and the flexible printed circuit board, and at least one area of the magnetic plate being disposed to face the wireless charging structure.

2. The electronic device of claim 1,
    wherein the first area extends from one end of the display panel and is bent towards the rear plate, and
    wherein the second area includes an area corresponding to at least a portion of the display panel and is spaced apart from the at least a portion of the display panel.

3. The electronic device of claim 2, wherein the second area of the flexible printed circuit board includes a coil area in which the wireless charging structure is disposed, and a shielding area extending from the coil area towards a front end portion or a rear end portion of the electronic device.

4. The electronic device of claim 3, further comprising:
    a main printed circuit board disposed between the bracket and the rear plate;
    a first connection structure at least partially disposed in the second area and electrically connecting the wireless charging structure to the main printed circuit board; and
    a second connection structure extending from one side of the second area and electrically connecting the flexible printed circuit board to the main printed circuit board.

5. The electronic device of claim 4, wherein the first connection structure includes a contact disposed to be in contact with one end portions of the transmission wires and an area of the main printed circuit board, the contact being formed to pass through a first opening in the bracket disposed between the flexible printed circuit board and the main printed circuit board.

6. The electronic device of claim 5,
    wherein the magnetic plate includes a second opening, and
    wherein at least a portion of the first opening and at least a portion of the second opening are arranged on a same line so as to allow the contact to pass therethrough.

7. The electronic device of claim 1, further comprising:
    a heat dissipation sheet disposed between the magnetic plate and the bracket,
    wherein at least a portion of the heat dissipation sheet has a size corresponding to that of the magnetic plate.

8. The electronic device of claim 1,
    wherein the coil portion includes at least one layer wound in a predetermined first shape designated by a first turn number, and
    wherein the wireless charging structure further includes:
        a core portion at least partially disposed inside the second area, the at least one layer and the transmission wires being embedded in the core portion; and
        a control circuit set to wirelessly transmit power using the coil portion.

9. The electronic device of claim 2, further comprising:
    a first antenna disposed at a rear end portion of the bracket; and
    a second antenna disposed at a front end portion of the bracket,
    wherein the second area of the flexible printed circuit board includes:
        a coil area in which the wireless charging structure is disposed; and
        a shielding area extending from the coil area towards a rear end portion of the electronic device, the shielding area being configured to block electromagnetic waves generated from the first antenna.

10. The electronic device of claim 9, further comprising:
    a shielding member disposed on a same plane as the flexible printed circuit board, the shielding member being disposed parallel to the shielding area with the coil area interposed therebetween,
    wherein the shielding member blocks electromagnetic waves generated from the second antenna.

11. The electronic device of claim 2, further comprising:
    a first antenna disposed at a lower end portion of the bracket; and
    a second antenna disposed at an upper end portion of the bracket,
    wherein the second area of the flexible printed circuit board includes:

a coil area in which the wireless charging structure is disposed;

a first shielding area extending from one end portion of the coil area towards a rear end portion of the electronic device, the first shielding area being configured to block electromagnetic waves generated from the first antenna; and a second shielding area extending from another end portion of the coil area towards a front end portion of the electronic device, the second shielding area being configured to block electromagnetic waves generated from the second antenna.

12. The electronic device of claim 11, wherein the magnetic plate extends from the first shielding area to the second shielding area across the coil area.

13. The electronic device of claim 11, further comprising:
a heat dissipation sheet disposed between the magnetic plate and the bracket,
wherein the magnetic plate is disposed to face the coil portion of the wireless charging structure, and
wherein the heat dissipation sheet extends to the coil area and the second shielding area.

14. An electronic device comprising:
a housing including a front plate and a rear plate forming an exterior of the electronic device;
a display assembly configured to output an image visible through the front plate, the display assembly including a display panel and a flexible printed circuit board stacked with the display panel;
a bracket disposed between the flexible printed circuit board and the rear plate, the bracket being configured to support internal components of the electronic device;
a main printed circuit board disposed between the bracket and the rear plate, and electrically connected to the flexible printed circuit board;
a first wireless charging structure disposed on one face of the flexible printed circuit board or inside the flexible printed circuit board, the first wireless charging structure including a coil portion and transmission wires electrically connected to the coil portion; and
a magnetic plate disposed between the bracket and the flexible printed circuit board, and at least one area of the magnetic plate being disposed to face the first wireless charging structure.

15. The electronic device of claim 14, wherein the flexible printed circuit board includes a coil area in which the first wireless charging structure is disposed, and a shielding area extending from the coil area towards a front end portion or a rear end portion of the electronic device.

16. The electronic device of claim 14, further comprising:
a second wireless charging structure disposed between the bracket and the rear plate.

17. The electronic device of claim 14, wherein the first wireless charging structure guides a generated magnetic flux to penetrate at the display assembly and at least a portion of the front plate in order to transmit/receive wireless power to/from an external wireless charging device or an external wireless transmitting device.

18. An electronic device comprising:
a housing including a front plate and a rear plate forming an exterior of the electronic device;
a display panel configured to output an image visible through the front plate;
a bracket disposed between the display panel and the rear plate, the bracket being configured to support internal components of the electronic device;
a flexible printed circuit board including a first area electrically connected to the display panel, and a second area extending from the first area and disposed between the display panel and the bracket; and
a wireless charging structure configured to output and/or receive a magnetic flux through the display panel, the wireless charging structure, including a coil portion and transmission wires electrically connected to the coil portion, disposed between the bracket and the display panel.

19. The electronic device of claim 18,
wherein the first area of the flexible printed circuit board extends from one end of the display panel and is bent towards the rear plate, and
wherein the wireless charging structure disposed on one surface of the second area of the flexible printed circuit board or inside the second area of the flexible printed circuit board.

20. The electronic device of claim 18, wherein the second area of the flexible printed circuit board includes a coil area in which the wireless charging structure is disposed, and a shielding area extending from the coil area towards a front end portion or a rear end portion of the electronic device.

* * * * *